United States Patent
Ho et al.

(10) Patent No.: US 11,916,115 B2
(45) Date of Patent: Feb. 27, 2024

(54) FIELD PLATE STRUCTURE TO ENHANCE TRANSISTOR BREAKDOWN VOLTAGE

(71) Applicant: Taiwan Semiconductor Manufacturing Company, Ltd., Hsin-Chu (TW)

(72) Inventors: Chia-Cheng Ho, Hsinchu (TW); Ming-Ta Lei, Hsin-Chu (TW); Yu-Chang Jong, Hsinchu (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 60 days.

(21) Appl. No.: 17/406,332

(22) Filed: Aug. 19, 2021

(65) Prior Publication Data

US 2021/0384302 A1    Dec. 9, 2021

Related U.S. Application Data

(63) Continuation of application No. 16/671,336, filed on Nov. 1, 2019, now Pat. No. 11,121,225.

(51) Int. Cl.
| | |
|---|---|
| H01L 29/40 | (2006.01) |
| H01L 29/66 | (2006.01) |
| H01L 23/528 | (2006.01) |
| H01L 27/088 | (2006.01) |
| H01L 23/522 | (2006.01) |
| H01L 29/78 | (2006.01) |

(52) U.S. Cl.
CPC ........ *H01L 29/402* (2013.01); *H01L 23/5226* (2013.01); *H01L 23/5283* (2013.01); *H01L 27/088* (2013.01); *H01L 29/401* (2013.01); *H01L 29/66681* (2013.01); *H01L 29/7823* (2013.01)

(58) Field of Classification Search
CPC ................. H01L 29/402; H01L 29/401; H01L 29/66681; H01L 29/7823; H01L 29/404; H01L 23/5226; H01L 23/5283; H01L 23/485; H01L 27/088
See application file for complete search history.

(56) References Cited

U.S. PATENT DOCUMENTS 9,590,053 B2 * 3/2017 Chou .................... H01L 29/407
10,586,865 B2   3/2020 Warrick et al.
(Continued)

OTHER PUBLICATIONS

Non-Final Office Action dated Feb. 1, 2021 for U.S. Appl. No. 16/671,336.
(Continued)

*Primary Examiner* — Dao H Nguyen
(74) *Attorney, Agent, or Firm* — Eschweiler & Potashnik, LLC

(57) ABSTRACT

Various embodiments of the present disclosure are directed towards an integrated chip including a field plate. A gate structure overlies a substrate between a source region and a drain region. A drift region is disposed laterally between the gate structure and the drain region. A first dielectric layer overlies the substrate. A field plate is disposed within the first dielectric layer between the gate structure and the drain region. A conductive wire overlies the first dielectric layer and contacts the field plate. At least a portion of the conductive wire directly overlies a first sidewall of the drift region.

20 Claims, 16 Drawing Sheets

(56) References Cited

U.S. PATENT DOCUMENTS

| | | |
|---|---|---|
| 2006/0175670 A1* | 8/2006 | Tsubaki ................ H01L 29/404 |
| | | 257/E21.252 |
| 2011/0001189 A1 | 1/2011 | Challa et al. |
| 2012/0319182 A1 | 12/2012 | Satoh et al. |
| 2013/0020632 A1* | 1/2013 | Disney ................ H01L 29/0847 |
| | | 257/E21.409 |
| 2013/0134512 A1 | 5/2013 | Cheng et al. |
| 2014/0367778 A1* | 12/2014 | Sharma ............ H01L 29/66681 |
| | | 438/286 |
| 2015/0048447 A1 | 2/2015 | Sharma et al. |
| 2015/0162442 A1 | 6/2015 | Chu et al. |
| 2016/0111509 A1 | 4/2016 | Yu et al. |
| 2016/0247914 A1 | 8/2016 | Chu et al. |
| 2019/0288066 A1* | 9/2019 | Lee .................. H01L 21/26586 |
| 2019/0288112 A1* | 9/2019 | Wang .................... H01L 29/517 |
| 2020/0227544 A1 | 7/2020 | Then et al. |
| 2020/0373395 A1 | 11/2020 | Ho et al. |

OTHER PUBLICATIONS

Notice of Allowance dated May 13, 2021 for U.S. Appl. No. 16/671,336.

* cited by examiner

FIELD PLATE STRUCTURE TO ENHANCE TRANSISTOR BREAKDOWN VOLTAGE

REFERENCE TO RELATED APPLICATION

This Application is a Continuation of U.S. application Ser. No. 16/671,336, filed on Nov. 1, 2019, the contents of which are hereby incorporated by reference in their entirety.

BACKGROUND

Modern day integrated chips comprise millions or billions of semiconductor devices formed on a semiconductor substrate (e.g., silicon). Integrated chips (ICs) may use many different types of transistor devices, depending on an application of an IC. In recent years, the increasing market for cellular and RF (radio frequency) devices has resulted in a significant increase in the use of high voltage transistor devices. For example, high voltage transistor devices are often used in power amplifiers in RF transmission/receiving chains due to their ability to handle high breakdown voltages and high frequencies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
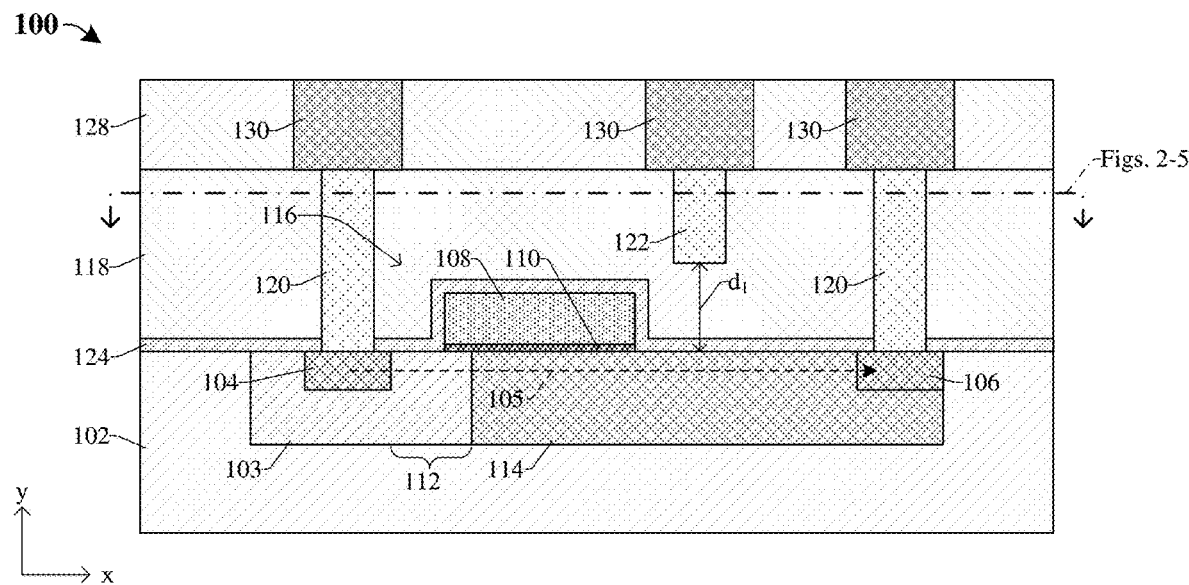
FIG. 1 illustrates a cross-sectional view of some embodiments of a high voltage transistor device having a field plate.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High voltage transistor devices are often constructed to have field plates. Field plates are conductive elements, which are placed over a drift region of a high voltage transistor device to enhance the performance of the device by manipulating electric fields (e.g., reducing peak electric fields) generated by a gate electrode of the high voltage transistor device. By manipulating the electric field generated by the gate electrode, the high voltage transistor device can achieve higher breakdown voltages. For example, a metal-oxide semiconductor field-effect transistor (MOSFET) device may comprise a field plate that overlies a drift region that is disposed between a channel region and a drain region. A breakdown voltage of the MOSFET device may be set by adjusting a distance between the field plate and the drift region. For example, as the distance between the field plate and the drift region increases the breakdown voltage increases.

Field plates can be formed in a number of different ways. For example, field plates may be formed by etching an ILD layer to concurrently form a field plate opening and conductive contact holes. To prevent the field plate from contacting the substrate, the field plate opening extends to within a contact mask that is below the ILD layer and directly over a drift region. However, in such configurations formation of the field plate opening utilizes processing steps that are difficult to control. The difficulty in controlling the processing steps may lead to over etching of the contact mask that can lead to damage of the drift region. For example, a high powered etch that is used to form conductive contact openings may make a distance between the field plate opening and the drift region difficult to set, and electrons may bombard and/or be deposited in the drift region and/or the ILD structure. In yet another alternative, insulating material can be formed within the drift region and below a field plate. While the insulating material separates the field plate from the drift region, the insulating material is in a main path of current flow, thereby driving current under the insulating material, increasing resistance of the MOSFET, and decreasing performance of the MOSFET.

Accordingly, the present disclosure relates to some embodiments of a method of forming a high voltage transistor device that uses multiple separate etch processes to form conductive contacts and a field plate in which the distance between the drift region and the field plate may be easily controlled. In some embodiments, the high voltage transistor device is fabricated by forming a gate electrode over a substrate and forming a source and a drain region in the substrate on opposing sides of the gate electrode. A contact etch stop layer (CESL) is formed over the substrate, and an ILD layer is formed over the CESL. Multiple separate etch processes are used to form conductive contacts and a field plate. The conductive contacts extend from the source and drain region to a top of the ILD layer. The field plate extends from the top of the ILD layer to a position that is vertically separated from the CESL by the ILD layer. By using multiple separate etch processes to form a field plate that is separated from the CESL by the ILD layer, a distance between the field plate and the drift region may be defined with high selectivity, thereby facilitating easy design of the breakdown voltage of the high voltage transistor.

FIG. 1 illustrates a cross-sectional view of some embodiments of a high voltage transistor device 100 having a field plate 122.

The high voltage transistor device 100 includes a source region 104 and a drain region 106 disposed within a substrate 102. The substrate 102 has a first doping type, while the source and drain regions 104, 106 respectively have a second doping type with a higher doping concentration than the substrate 102. In some embodiments, the first doping type may be p-type and the second doping type may be n-type, or vice versa.

A gate structure 116 overlies the substrate 102 at a position that is laterally arranged between the source region 104 and the drain region 106. The gate structure 116 comprises a gate electrode 108 that is separated from the substrate 102 by a gate dielectric layer 110. A contact etch stop layer (CESL) 124 is disposed over the gate structure and the substrate 102. Upon receiving a bias voltage, the gate electrode 108 is configured to generate an electric field that controls the movement of charge carriers within a channel region 112 laterally disposed between the source region 104 and the drain region 106. The channel region 112 is disposed within a body region 103 and laterally extends from the source region 104 to an adjacent drift region 114 (i.e., a drain extension region). The body region 103 has the first doping type (e.g., p-type) with a doping concentration that is higher than that of the substrate 102. The drift region 114 has the second doping type (e.g., n-type) and may have a relatively low doping concentration (e.g., less than the source and drain regions 104, 106), which provides for a higher resistance at high operating voltages. The gate structure 116 is disposed over the channel region 112. In some embodiments, the gate structure 116 may extend from over the channel region 112 to a position overlying a portion of the drift region 114.

A first inter-level dielectric (ILD) layer 118 overlies the substrate 102. In some embodiments, the first ILD layer 118 comprises a first ILD material. One or more conductive structures are disposed within the first ILD layer 118. In some embodiments, the one or more conductive structures comprise a plurality of contacts 120 configured to provide vertical connections between the source region 104, the drain region 106, and/or the gate electrode 108 (not shown) and a plurality of wires 130 overlying the contacts 120 and disposed within a second ILD layer 128. The plurality of contacts 120 and the plurality of wires 130 are a part of conductive interconnect layers. The contacts 120 may be a first layer of the conductive interconnect layers and the wires 130 may be a second layer of the conductive interconnect layers.

The one or more conductive structures may further comprise the field plate 122. The field plate 122 is disposed within the first ILD layer 118 at a position between the drain region 106 and the gate electrode 108. The field plate 122 comprises a metal material different than a material of the gate electrode 108. In some embodiments, the metal material of the field plate 122 is the same as a material of the contacts 120. In some other embodiments, the metal material of the field plate 122 is the same as a material of the wires 130. In some embodiments, the field plate 122 is vertically offset the CESL 124 by a non-zero distance. In such embodiments, the first ILD layer 118 separates a bottom of the field plate 122 from the CESL 124. The field plate 122 is separated from a top surface of the substrate 102 by a distance $d_1$. In some embodiments, the distance $d_1$ is non-zero.

During operation of the high voltage transistor device 100, a gate-source voltage can be selectively applied to the gate electrode 108 relative to the source region 104, forming a conductive channel in the channel region 112. While the gate-source voltage is applied to form the conductive channel, a drain to source voltage is applied to move charge carriers (e.g., shown by arrow 105) between the source region 104 and the drain region 106. The field plate 122 is configured to act upon the electric field generated by the gate electrode 108. The field plate 122 may be configured to change a distribution of the electric field generated by the gate electrode 108 in the drift region 114. This, in part, enhances the breakdown voltage capability of the high voltage transistor device 100. For example, as the distance $d_1$ increases, the breakdown voltage of the high voltage transistor device 100 increases.

Figure 2:
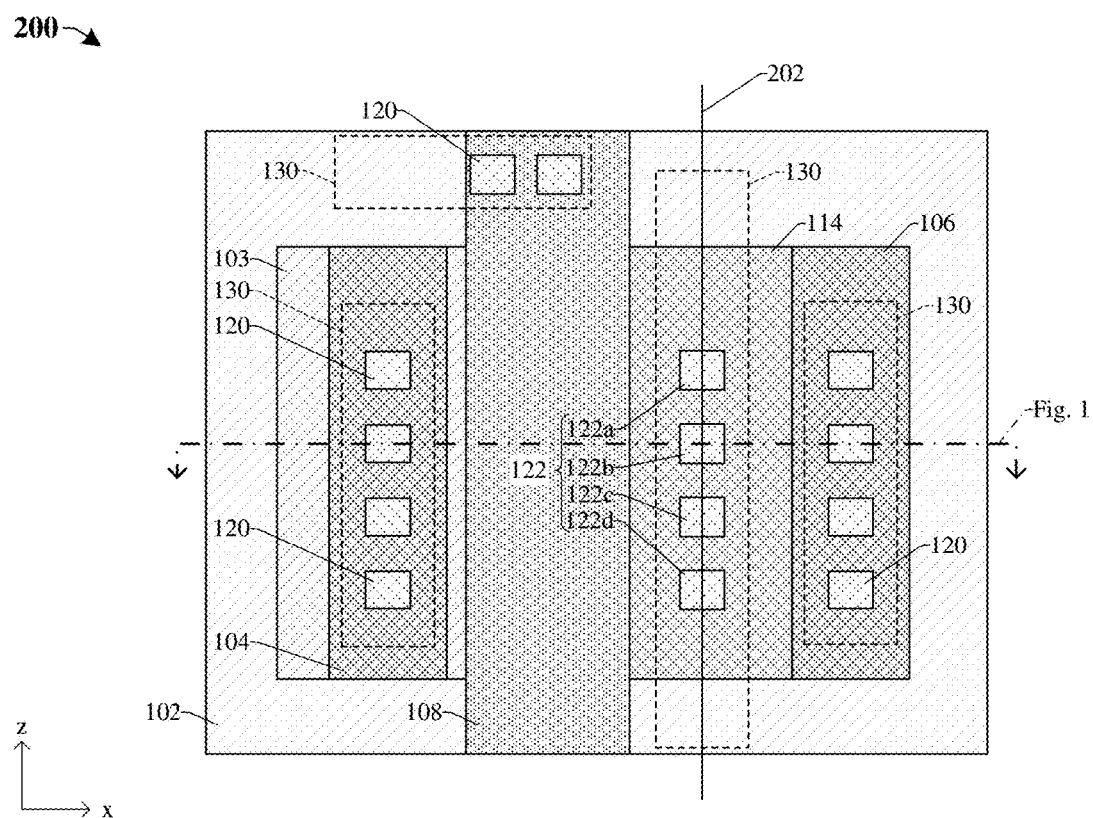
FIGS. 2-5 illustrate top views of various alternative embodiments of the high voltage transistor device of FIG. 1.

FIG. 2 illustrates a top view 200 of alternative embodiments of the high voltage transistor device 100 of FIG. 1. For ease of illustration, the CESL 124 and the first ILD layer 118 of FIG. 1 have been omitted from the top view 200 of FIG. 2.

As shown in FIG. 2, the field plate 122 includes one or more field plate vias 122a-d that extend from the wire 130 to a point in the first ILD layer (118 of FIG. 1) above the drift region 114. The one or more field plate vias 122a-d may, for example, each have a different distance to the top surface of the substrate 102 due to inconsistencies in an etching processes used to define the field plate 122. Thus, in some embodiments, a minimum distance between the one or more field plate vias 122a-d and the top surface of the substrate 102 is defined by the distance $d_1$ of FIG. 1, such that each field plate via 122a-d is separated from the top surface of the substrate 102 by at least a non-zero distance. In some embodiments, a widthwise center of each field plate via 122a-d is disposed along a substantially straight line 202 extending in a first direction (e.g., along the z-axis). In some embodiments, the substantially straight line 202 is parallel with the top surface of the substrate 102. Further, a widthwise center of the wire 130 overlying the field plate 122 is disposed along the substantially straight line 202. In some embodiments, when viewed from above, the field plate vias 122a-d each have a rectangular, square, or circular/elliptical shape. A wire 130 overlies a segment of the gate electrode 108 and contacts 120 extend from the wire 130 to the gate electrode 108. In some embodiments, the field plate vias 122a-d are evenly spaced along the substantially straight line 202, such that each field plate via 122a-d is laterally spaced from an adjacent field plate via by a same distance.

Figure 3:
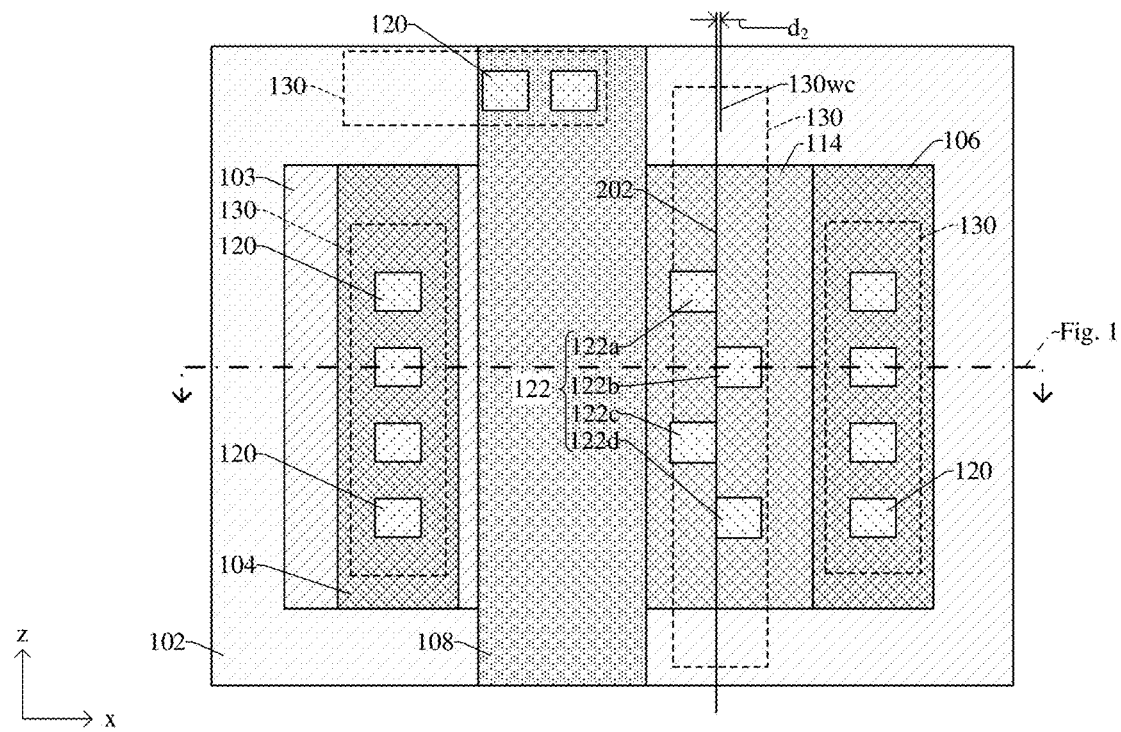

FIG. 3 illustrates a top view 300 of alternative embodiments of the high voltage transistor device 100 of FIG. 1. For ease of illustration, the CESL 124 and the first ILD layer 118 of FIG. 1 have been omitted from the top view 300 of FIG. 3.

As shown in FIG. 3, the field plate 122 includes one or more field plate vias 122a-d that extend from the wire 130 to a point in the first ILD layer (118 of FIG. 1) above the drift region 114. In some embodiments, the field plate 122 includes two or more field plate vias 122a-d that are laterally offset from one other (along the y-axis). In other embodiments, an outer edge of each field plate via 122a-d is disposed along a substantially straight line 202 that extends in a first direction (e.g., along the z-axis). In some embodiments, an outer edge of two of the field plate vias 122a, 122c are laterally outside an outer sidewall of the overlying wire 130. The substantially straight line 202 is laterally offset a widthwise center 130wc of the wire 130 by a distance $d_2$. In some embodiments, the distance $d_2$ is non-zero, or the distance $d_2$ is zero, such that the substantially straight line 202 is disposed along the widthwise center 130wc of the wire 130 (not shown). In some embodiments, the field plate vias 122a-d are alternatingly spaced along the substantially straight line 202, such that a widthwise center of every other field plate via is laterally offset from a widthwise center of an adjacent field plate via. For example, a widthwise center of a second field plate via 122b is laterally offset a widthwise center of a first field plate via 122a and a widthwise center of a third field plate via 122c. Further, the widthwise center of the second field plate via 122b is aligned with a widthwise center of a fourth field plate via 122d.

Figure 4:
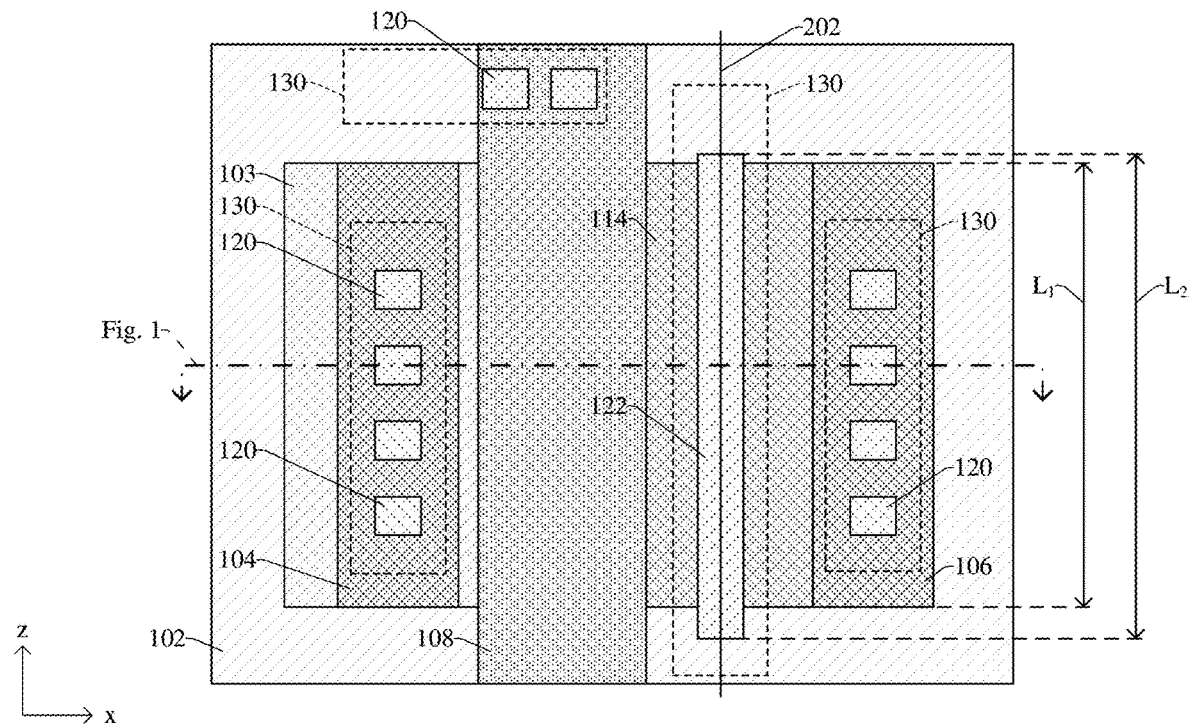

FIG. 4 illustrates a top view 400 of alternative embodiments of the high voltage transistor device 100 of FIG. 1. For ease of illustration, the CESL 124 and the first ILD layer 118 of FIG. 1 have been omitted from the top view 400 of FIG. 4.

As shown in FIG. 4, the field plate 122 is a single continuous via extending over the drift region 114. The single continuous via has a rectangular shape with a length that is greater than a width. In some embodiments, a widthwise center of the field plate 122 is disposed along a substantially straight line 202 that extends in a first direction (e.g., along the z-axis). Additionally, a widthwise center of an overlying wire 130 is disposed along the substantially straight line 202. In some embodiments, a first length $L_1$ of the field plate 122 is greater than a second length $L_2$ of the drift region 114. Furthermore, opposing outer sidewalls of the field plate 122 are disposed laterally outside of the drift region 114. In other embodiments (not shown), a first length $L_1$ of the field plate 122 may be less than a second length $L_2$ of the drift region 114.

Figure 5:
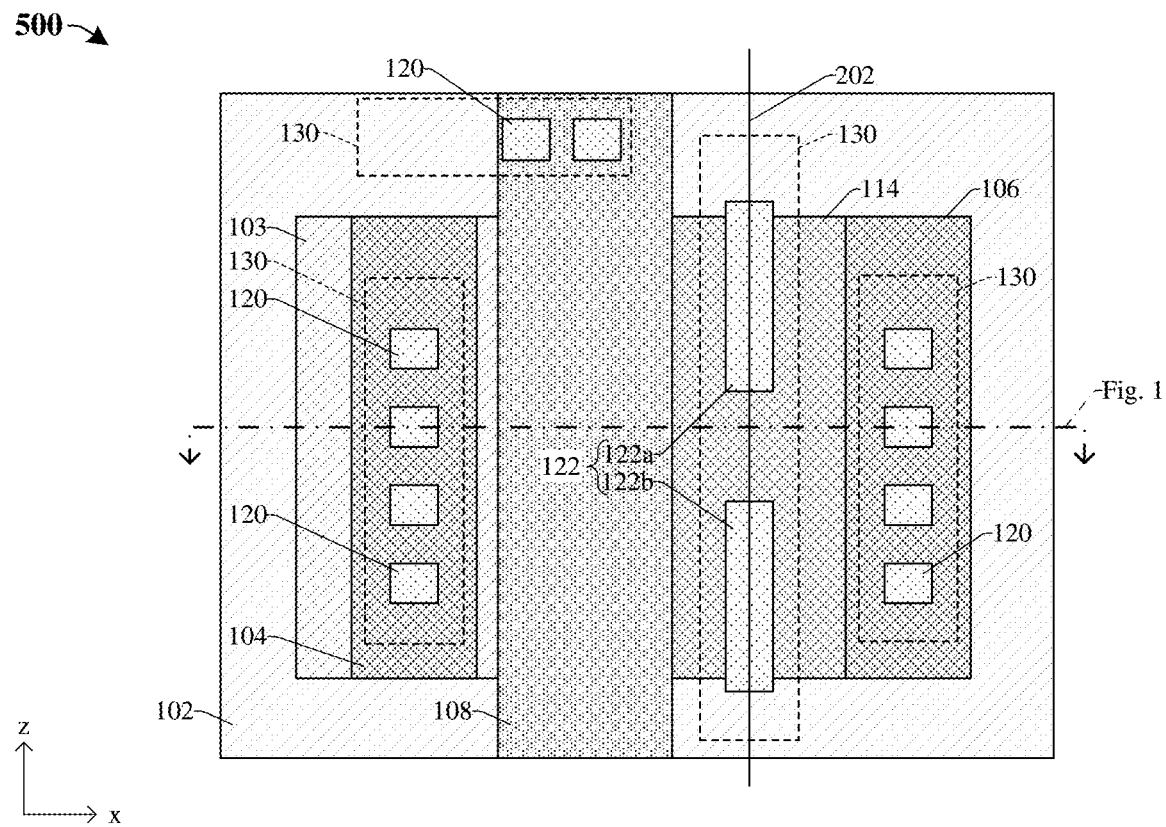

FIG. 5 illustrates a top view 500 of alternative embodiments of the high voltage transistor device 100 of FIG. 1. For ease of illustration, the CESL 124 and the first ILD layer 118 of FIG. 1 have been omitted from the top view 500 of FIG. 5.

As shown in FIG. 5, the field plate 122 includes a first elongated via 122a and a second elongated via 122b. The first elongated via 122a and the second elongated via 122b via respectively have a rectangular shape with a length that is greater than a width. In some embodiments, a widthwise center of the first elongated via 122a and a widthwise center of the second elongated via 122b are each disposed along a substantially straight line 202 that extends in a first direction (e.g., along the z-axis). Additionally, in some embodiments, a widthwise center of an overlying wire 130 is disposed along the substantially straight line 202. The first elongated via 122a extends over a first outer edge of the drift region 114 and the second elongated via 122b extends over a second outer edge of the drift region 144, such that the first outer edge is opposite the second outer edge. In some embodiments, the first elongated via 122a is separated from the second elongated via 122b by a first space that is greater than a space between adjacent ones of the conductive contacts 120 overlying the source region 104 and/or the drain region 106.

Figure 6:
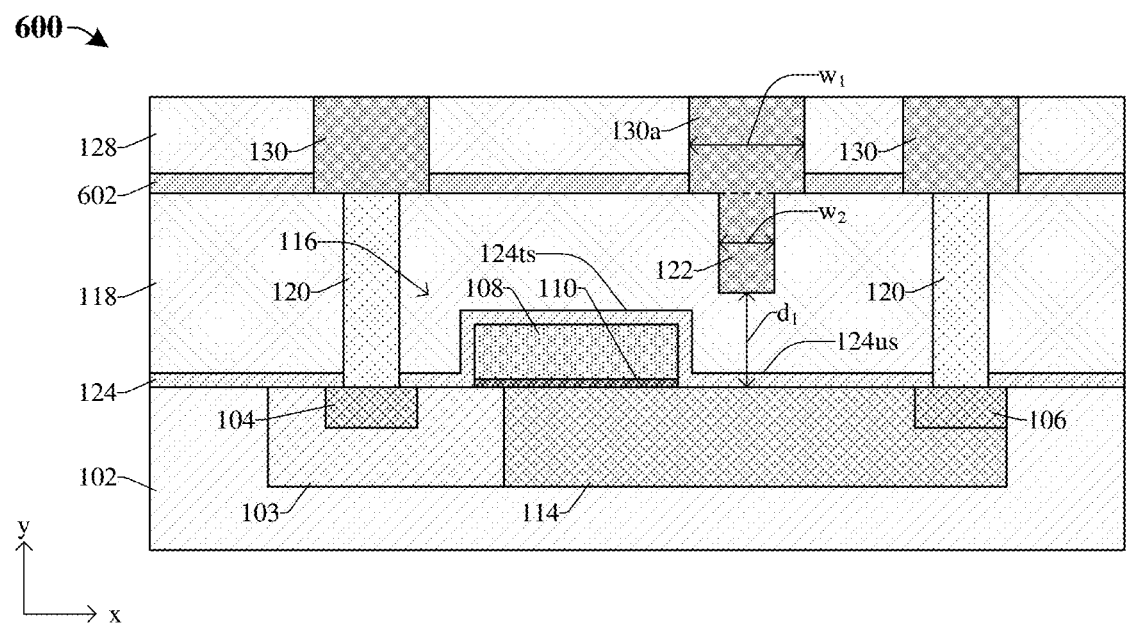
FIGS. 6-9 illustrate cross-sectional views of various alternative embodiments of a metal-oxide semiconductor field-effect transistor (MOSFET) device having a field plate.

FIG. 6 illustrates a cross-sectional view of some embodiments of a metal-oxide semiconductor field-effect transistor (MOSFET) device 600 having a field plate 122.

The MOSFET device 600 includes a source region 104 and a drain region 106 disposed within a substrate 102. In some embodiments, the substrate 102 may, for example, be a bulk substrate (e.g., a bulk silicon substrate), a silicon-on-insulator (SOI) substrate, or some other suitable substrate. The substrate 102 has a first doping type, while the source region 104 and the drain region 106 comprise highly doped regions having a second doping type different than the first doping type. In some embodiments, the first doping type may be p-type and the second doping type may be n-type, or vice versa. In some embodiments, the source region 104 and/or the drain region 106 may have doping concentrations that are approximately $10^{19}$ atoms/cm$^3$ or greater.

The source region 104 is disposed within a body region 103 that is disposed within the substrate 102. The body region 103 has the first doping type with a doping concentration that is higher than that of the substrate 102. For example, the substrate 102 may have a doping concentration that is within a range of about $10^{14}$ to $10^{16}$ atoms/cm$^3$, while the body region 103 may have a doping concentration that is within a range of about $10^{16}$ to $10^{18}$ atoms/cm$^3$.

A gate structure 116 overlies the substrate 102 at a position that is laterally arranged between the source region 104 and the drain region 106. In some embodiments, the gate structure 116 may laterally extend from over the body region 103 to a position overlying a portion of the drift region 114. The gate structure 116 includes a gate electrode 108 that is separated from the substrate 102 by a gate dielectric layer 110. In some embodiments, the gate dielectric layer 110 may comprise silicon dioxide, a high-κ dielectric material, or the like. As used herein, a high-κ dielectric material is a dielectric material with a dielectric constant greater than 3.9. In some embodiments, the gate electrode 108 comprises polysilicon and/or a metal gate material (e.g., tungsten, titanium, tantalum, titanium nitride, tantalum nitride, aluminum, a combination of the aforementioned, or the like).

The drain region 106 is at least partially disposed within a drift region 114 that is arranged with within the substrate 102 at a position laterally abutting the body region 103. In some embodiments, the drift region 114 comprises the second doping type (e.g., n-type) having a relatively low doping concentration, which provides for a higher resistance when the MOSFET device 600 is operated at high voltages (e.g., about 20-50 V or up to 200 V). For example, if the substrate 102 comprises silicon, then the high voltages may be up to 50 V. In another example, if the substrate 102 comprises gallium arsenide, germanium, or the like, then the high voltages may be up to 200 V. In further embodiments, if the doping concentration of the drift region 114 is increased, then a resistance of the drift region 114 may be reduced. However, as the doping concentration of the drift region 114 is increased, the breakdown voltage of the MOSFET device 600 will decrease, thereby preventing operation at high voltages. In the aforementioned embodiment, if the doping concentration of the drift region 114 is increased, the distance $d_1$ between the field plate 122 and the drift region 114 may be increased, thereby decreasing the resistance of the drift region 114 and increasing the breakdown voltage of the MOSFET device 600. Thus, in some embodiments, the drift region 114 may have a doping concentration that is within a range of about $10^{18}$ to $10^{20}$ atoms/cm$^3$.

A contact etch stop layer (CESL) 124 extends along an upper surface of the substrate 102 and sides of the gate structure 116. In some embodiments, the CESL 124 continuously extends from the gate structure 116 over the drift region 114 beyond sidewalls of the drain region 106. In some embodiments, the CESL 124 may, for example, be or comprise silicon oxynitride, silicon dioxide, silicon nitride, or the like.

A first inter-level dielectric (ILD) layer 118 overlies the CESL 124. In some embodiments, the first ILD layer 118 comprises a different material than the CESL 124. The first ILD layer 118 comprises a first ILD material. The first ILD material may, for example, be or comprise an oxide, such as silicon dioxide, a low-κ dielectric material, or the like. As used herein, a low-κ dielectric material is a dielectric material with a dielectric constant less than 3.9. An upper etch stop layer 602 overlies the first ILD layer 118. A second ILD layer 128 overlies the upper etch stop layer 602. Contacts 120 extend from wires 130 through the first ILD layer 118 and the CESL 124 to the source and drain regions 104, 106. The wires 130 are disposed within the second ILD layer 128 and are configured to electrically couple the MOSFET device 600 to overlying conductive layers (not shown). In some embodiments, the upper etch stop layer 602 may, for example, be or comprise silicon nitride, silicon carbide, or the like. The second ILD layer 128 comprises a second ILD material. The second ILD material may, for example, be or comprise silicon dioxide, a low-κ dielectric material, or the like. In some embodiments, the wires 130 include a field plate wire 130a that directly overlies a field plate 122.

The field plate 122 vertically extends from the field plate wire 130a to a point disposed below a top surface of the first ILD layer 118. The field plate 122 is disposed laterally between the gate electrode 108 and the drain region 106. In some embodiments, the field plate 122 comprises a same material as the field plate wire 130a. In further embodiments, the field plate 122 and the field plate wire 130a are a single continuous conductive material, such that the field plate 122 is a protrusion of the field plate wire 130a that extends from a bottom surface of the field plate wire 130a into the first ILD layer 118. In some such embodiments, the field plate 122 may comprise a conductive core (e.g., a copper core, an aluminum core, or the like) surrounded by a diffusion barrier layer (e.g., titanium nitride, tantalum nitride, or the like) and/or a glue layer. The diffusion barrier layer may continuously extends from along sidewalls of the field plate wire 130a to along sidewalls and a lower surface of the field plate 122.

The field plate 122 is vertically offset the CESL 124, such that the field plate 122 may, for example, not contact the CESL 124. In some embodiments, a bottom surface of the field plate 122 may be vertically between a top surface of the gate electrode 108 and a top surface of the first ILD layer 118. In other embodiments (not shown), a bottom surface of the field plate 122 may be disposed below a top surface of the gate electrode 108. The contacts 120 may, for example, be or comprise aluminum, titanium, tantalum, tungsten, titanium nitride, tantalum nitride, or the like. The wires 130 (including the field plate wire 130a) may, for example, be or comprise aluminum, copper, an alloy of the aforementioned, or the like. In some embodiments, a bottom surface of the field plate 122 may be disposed between a top surface 124ts and an upper surface 124us of the CESL 124 (not shown). Further, the field plate 122 may be laterally offset a sidewall of the CESL 124 in a direction towards the drain region 106 by a non-zero distance.

The bottom surface of the field plate 122 is vertically offset the top surface of the substrate 102 by the distance $d_1$, such that a breakdown voltage of the MOSFET device 600 increases as the distance $d_1$ increases. In some embodiments, the distance $d_1$ is defined between the upper surface 124us of the CESL 124 and the bottom surface of the field plate 122 (not shown). In some embodiments, the distance $d_1$ is within a range of about 5 to 100 nanometers. In further embodiments, if the distance $d_1$ is, for example, 5 nanometers or greater, then the breakdown voltage of the MOSFET device 600 is increased while preventing damage to the substrate 102 during a formation of the MOSFET device 600. In yet further embodiments, if the distance $d_1$ is, for example, 100 nanometers or less, then the breakdown voltage of the MOSFET device 600 is increased while mitigating fabrication costs of the MOSFET device 600. In some embodiments, if the distance $d_1$ is 100 nanometers or greater, then the breakdown voltage of the MOSFET device 600 may not further increase. In some embodiments, a thickness of the field plate 122 is greater than a thickness of the gate electrode 108.

The field plate wire 130a has a first width $w_1$ and the field plate 122 has a second width $w_2$, such that the first width $w_1$ is greater than the second width $w_2$. In some embodiments, the second width $w_2$ of the field plate 122 is within a range of about 20 to 1000 nanometers. In further embodiments, if the second width $w_2$ is, for example, 20 nanometers or greater, then the breakdown voltage of the MOSFET device 600 is increased. In yet further embodiments, if the second width $w_2$ is, for example, 1000 nanometers or less, then the breakdown voltage of the MOSFET device is increased while mitigating fabrication costs associated with forming the field plate 122.

Figure 7:
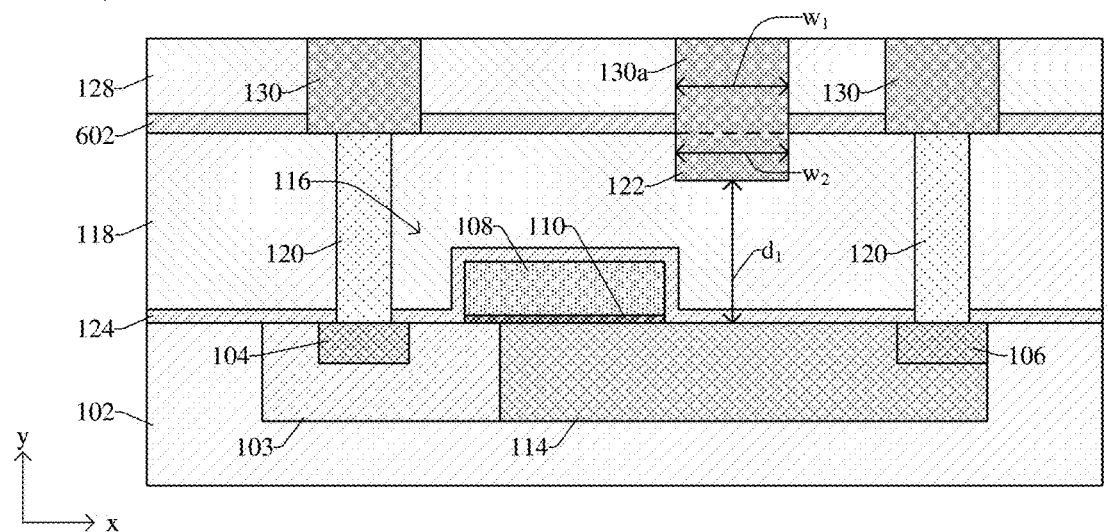

FIG. 7 illustrates a cross-sectional view of a MOSFET device 700 according to some alternative embodiments of the MOSFET device 600 of FIG. 6.

In some embodiments, a first width $w_1$ of the field plate wire 130a is equal to a second width $w_2$ of the field plate 122. Further, a thickness of the field plate 122 is less than a thickness of the gate electrode 108. The field plate 122 comprises a same material as the field plate wire 130a (e.g., aluminum, copper, or an alloy of the aforementioned).

Figure 8:
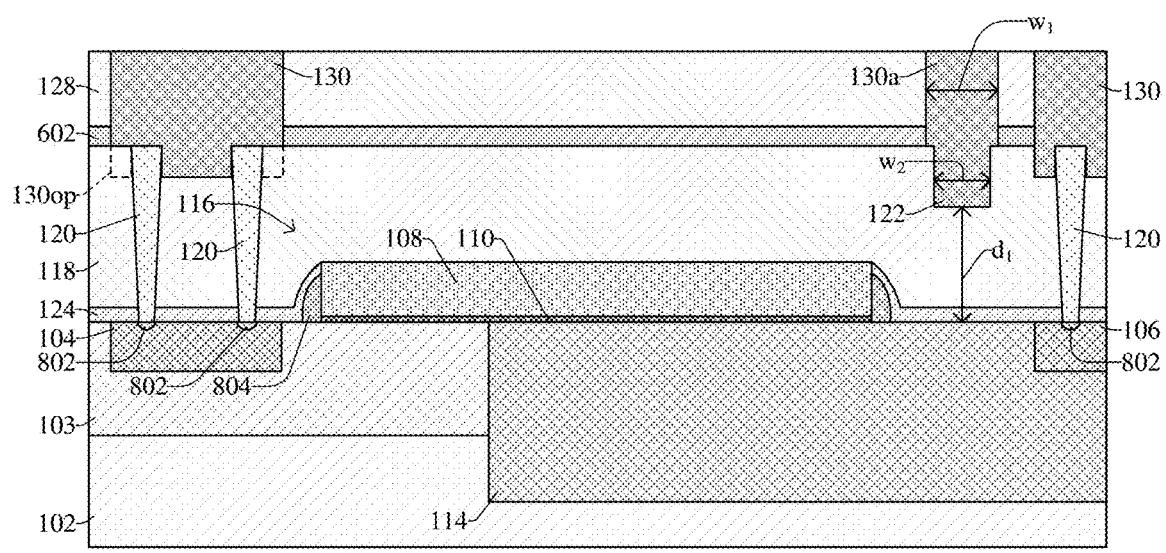

FIG. 8 illustrates a cross-sectional view of a MOSFET device 800 according to some alternative embodiments of the MOSFET device 600 of FIG. 6.

Silicide layers 802 are disposed over and/or within the substrate 102. The silicide layers 802 are configured to enhance electrical coupling between the contacts and underlying substrate regions (e.g., the source region 104 and/or the drain region 106). A sidewall spacer structure 804 surrounds sidewalls of the gate electrode 108 and the gate dielectric layer 110. In some embodiments, the field plate 122 comprises a same material as the wires 130. In some embodiments, the wires 130 respectively comprise protrusions that extend from above a top surface of the contacts 120 to a point below the top surface of the contacts 120. The protrusions of the wires may respectively extend along an outer surface of at least one of the contacts 120. In some embodiments, the field plate 122 may extend to a greater depth within the first ILD layer 118 than the protrusions. In such embodiments, a horizontal line that is parallel to an upper surface of the gate electrode 108 may extend along a bottom of one of the protrusions and through a sidewall of the field plate 122. In further embodiments, a wire 130 overlying the source region 104 comprises an outer protrusion 130op that surrounds outer sidewalls of two or more contacts 120 that overlie the source region 104.

Figure 9:
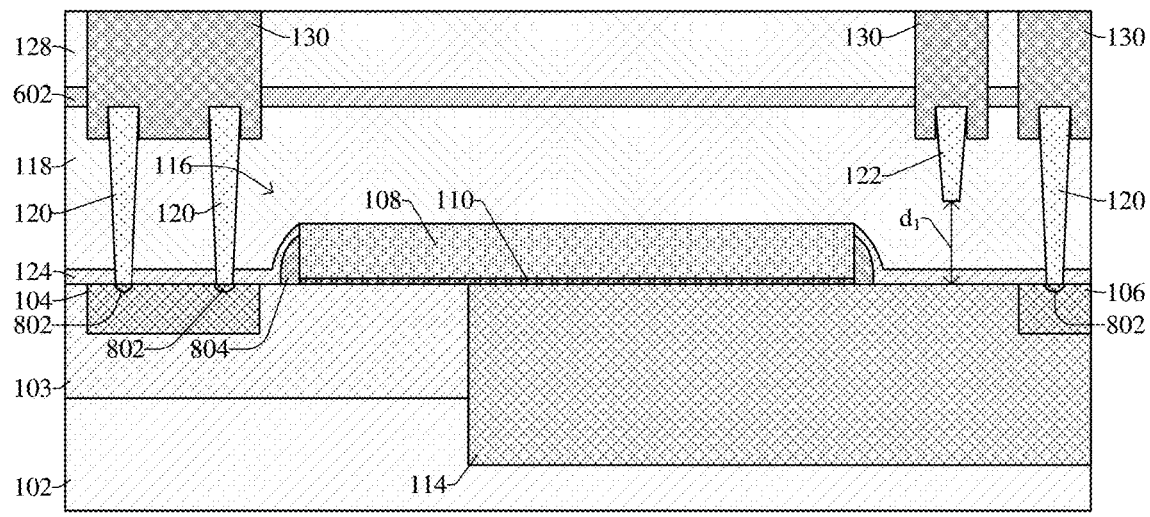

FIG. 9 illustrates a cross-sectional view of a MOSFET device 900 according to some alternative embodiments of the MOSFET device 800 of FIG. 8.

In some embodiments, the field plate 122 comprises a same material as the contacts 120. A wire 130 overlying the field plate 122 comprises a protrusion that extends into the first ILD layer 118 and surrounds outer sidewalls of the field plate 122. In some embodiments, the wire 130 may comprise a different material than the field plate 122. In some embodiments, the wire 130 may comprise a conductive core that is surrounded by a diffusion barrier layer. In such embodiments, the diffusion barrier layer may vertically and laterally separate the field plate 122 from the conductive core.

In some embodiments, the field plate 122 may extend to a vertical position that intersects a horizontal line extending along a top surface of the first ILD layer 122. In other embodiments (not shown), the field plate 122 may be recessed below a horizontal line extending along the top surface of the first ILD layer 122.

Although FIGS. 2-5 describe and illustrate the field plate 122 as having a material the same as the contacts 120, it will be appreciated that the field plate 122 of FIGS. 2-5 is not limited to such a configuration. Rather, in alternative embodiments, the field plate 122 of FIGS. 2-5 may be configured as the field plate 122 is illustrated and described in the cross-sectional views of FIGS. 6-9. For example, the field plate 122 of FIGS. 2-5 may be a protrusion of a directly overlying wire 130 (e.g., the field plate wire 130a of FIG. 6), thereby comprising a same material as the directly overlying wire 130. In yet another example, the field plate 122 of FIGS. 2-5 may have a same width of the directly overlying wire 130.

FIGS. 10-15 illustrate cross-sectional views 1000-1500 of some embodiments of a first method of forming a high voltage transistor device having a field plate according to the present disclosure. Although the cross-sectional views 1000-1500 shown in FIGS. 10-15 are described with reference to a method, it will be appreciated that the structures shown in FIGS. 10-15 are not limited to the method but rather may stand alone separate of the method. Although FIGS. 10-15 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 10:
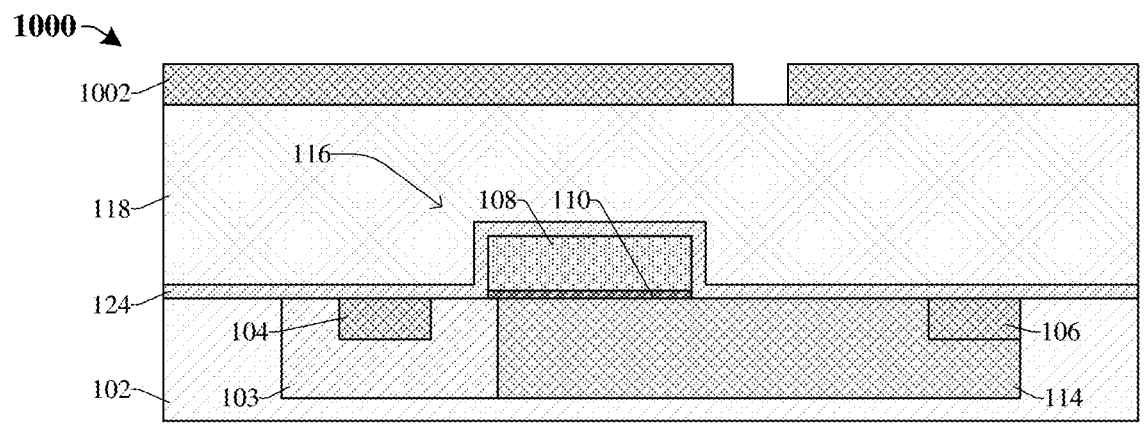
FIGS. 10-15 illustrate cross-sectional views of some embodiments of a first method of forming a high voltage transistor device having a field plate.

As shown in cross-sectional view 1000 of FIG. 10, a gate structure 116 is formed over a substrate 102. In some embodiments, a method for forming the gate structure of FIG. 10 may include forming the gate dielectric layer 110 over the substrate 102. The gate electrode 108 is formed over the gate dielectric layer 110. After forming the gate electrode 108, the source region 104 and the drain region 106 may be formed in the substrate 102 by an implantation process. In some embodiments, other doped regions (e.g., drift region 114 and body region 103) may be formed by one or more other implantation process(es) before forming the gate dielectric layer 110. In further embodiments, a portion of the doped regions may be formed before forming the gate dielectric layer 110, and/or a remaining portion of the other doped regions may be formed after forming the gate dielectric layer 110.

The CESL 124 is formed over the substrate 102 and around the gate structure 116. The first inter-level dielectric (ILD) layer 118 is formed over the CESL 124 and the gate structure 116. A first masking layer 1002 is formed over the first ILD layer 118 with an opening overlying the drift region 114. In some embodiments, the first masking layer 1002 may, for example, be or comprise a hard mask, a photoresist, or the like. In some embodiments, the first ILD layer 118 may be formed using a deposition process such as, for example, chemical vapor deposition (CVD), physical vapor deposition (PVD), some other suitable deposition process (es), or any combination of the foregoing. In various embodiments, the first masking layer 1002 may be formed by a deposition process (e.g., CVD, PVD, or the like), a spin coating process, or the like.

Figure 11:
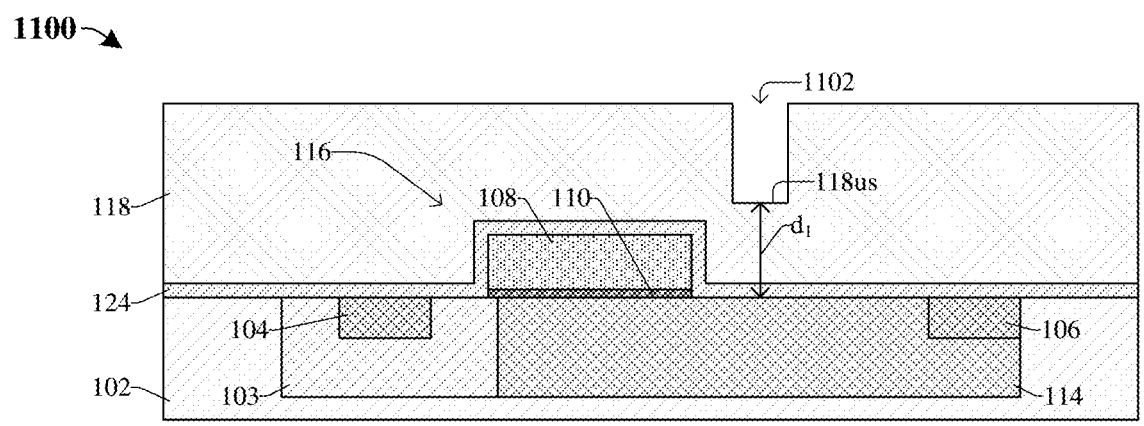

As shown in cross-sectional view 1100 of FIG. 11, a first etch process is performed on the structure of FIG. 10 according to the first masking layer (1002 of FIG. 10). The first etch process forms sidewalls and an upper surface 118us of the first ILD layer 118 that define at least one field plate opening 1102. In some embodiments, the first etch process is a dry etch process in which the first ILD layer 118 is exposed to one or more etchants. In some embodiments, the one or more etchants may comprise dry etchants (e.g., having an etching chemistry comprising fluorine, chlorine, or the like). In some embodiments, a power of the first etch process may be within a range of about 100 to 1,000 Watts (W). The first etch process is configured to define a distance $d_1$ between the upper surface 118us of the first ILD layer 118 and a top surface of the substrate 102. In some embodiments, the distance $d_1$ is within a range of about 5 to 100 nanometers and is defined by controlling a time of the first etch process. For example, a time duration of the first etch process is within a range of 0.1 to 1,000 seconds. In some embodiments, after performing the first etch process, a removal process is performed to remove the first masking layer (1002 of FIG. 10).

Figure 12:
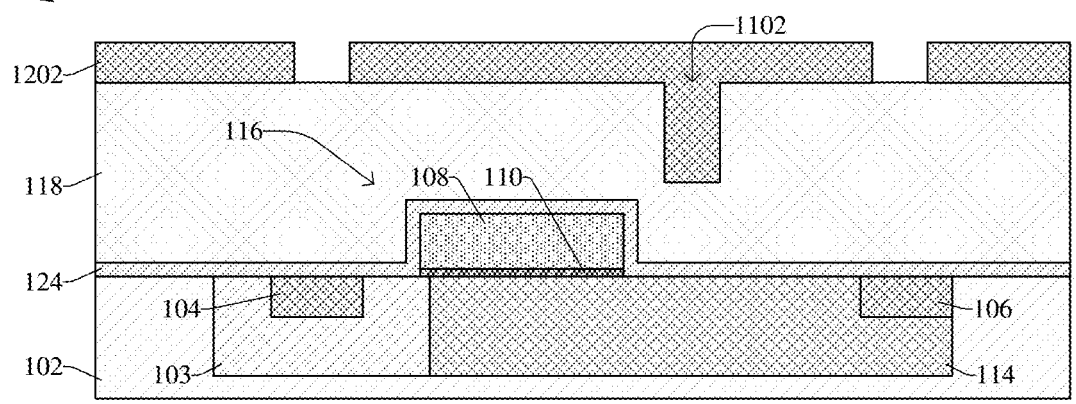

As shown in cross-sectional view 1200 of FIG. 12, a second masking layer 1202 is formed over the first ILD layer 118. The second masking layer 1202 fills the at least one field plate opening 1102. The second masking layer 1202 further comprises sidewalls defining apertures configured to define one or more contact openings. In some embodiments, the second masking layer 1202 may, for example, be or comprise one or more layers of a hard mask, a photoresist, or the like. In some embodiments, the second masking layer 1202 may comprise a photoresist material patterned to define the apertures.

Figure 13:
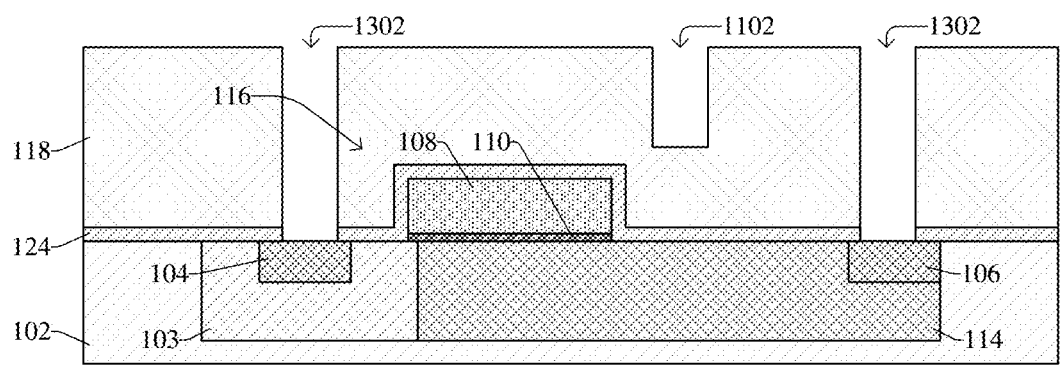

As shown in cross-sectional view 1300 of FIG. 13, a second etch process is performed on the structure of FIG. 12 according to the second masking layer (1202 of FIG. 12). The second etch process defines contact openings 1302. Because the second masking layer (1202 of FIG. 12) fills the at least one field plate opening 1102, the second etch process does not increase a depth of the field plate opening 1102, so that the contact openings 1302 extend below the field plate opening 1102. In some embodiments, the second etch process is a dry etch process in which the first ILD layer 118 and the CESL 124 are exposed to one or more etchants. In some embodiments, after performing the second etch process, a removal process is performed to remove the second masking layer (1202 of FIG. 12). In some embodiments, the second etch process includes reaching a higher maximum etch power than the first etch process. In some embodiments, a power of the second etch process may be within a range of about 100 to 1,000 Watts.

Figure 14:
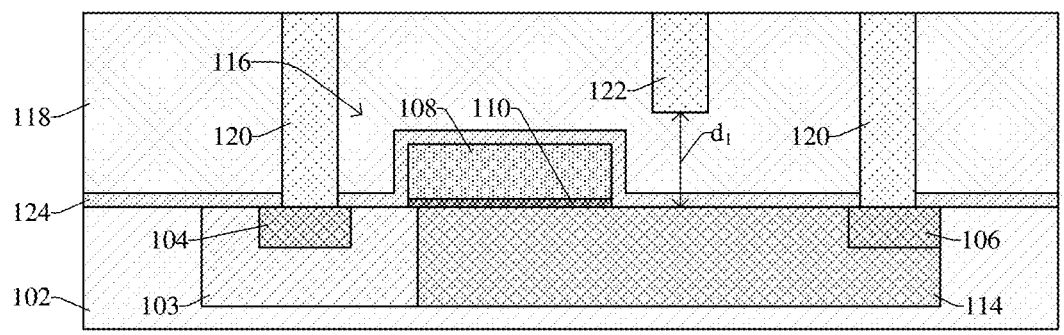

As shown in cross-sectional view 1400 of FIG. 14, contacts 120 are formed in the contact openings (1302 of FIG. 13) and a field plate 122 is formed in the at least one field plate opening (1102 of FIG. 13). In some embodiments, a method for forming the contacts 120 and/or the field plate 122 includes: forming a conductive material (e.g., aluminum, titanium, tantalum, tungsten, titanium nitride, tantalum nitride, or the like) over the first ILD layer 118, thereby filling the contact openings (1302 of FIG. 13) and the at least one field plate opening (1102 of FIG. 13); and performing a planarization process (e.g., a chemical mechanical planarization (CMP) process) on the conductive material until a top surface of the first ILD layer 118 is reached. Thus, the field plate 122 comprises a same material (e.g., aluminum, titanium, tantalum, tungsten, titanium nitride, tantalum nitride, or the like) as the contacts 120 and is separated from the top surface of the substrate 102 by the distance $d_1$.

Figure 15:
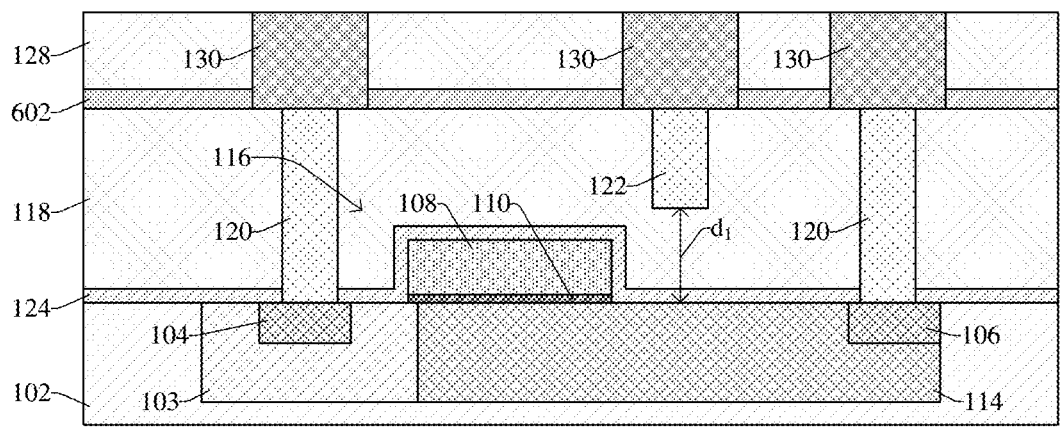

As shown in cross-sectional view 1500 of FIG. 15, an upper etch stop layer 602 is formed over the first ILD layer 118. A second ILD layer 128 is formed over the upper etch stop layer 602. Additionally, wires 130 are formed in the second ILD layer 128 over the contacts 120 and the field plate 122. In some embodiments, the wires 130 are formed by a damascene process (e.g., a single damascene process) and/or may comprise a material different from the field plate 122. In some embodiments, the second ILD layer 128 and/or the upper etch stop layer 602 may be formed using a deposition process such as, for example, CVD, PVD, some other suitable deposition process.

Figure 16:
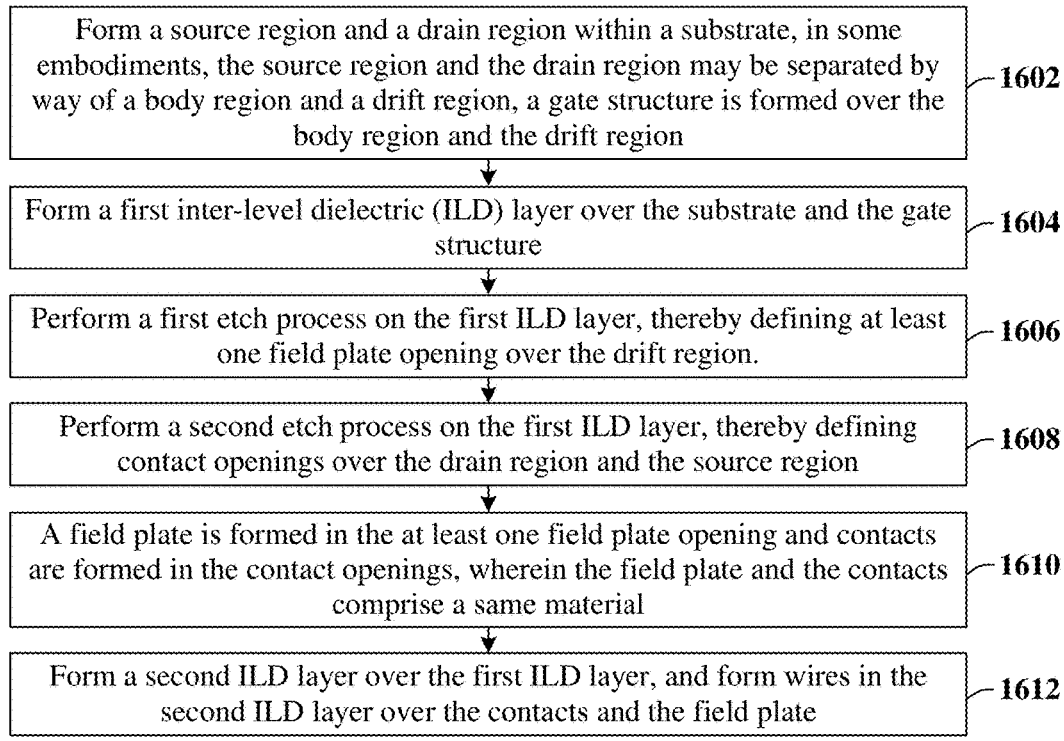
FIG. 16 illustrates a methodology in flowchart format that illustrates some embodiments of the first method of forming a high voltage transistor device having a field plate.

FIG. 16 illustrates a first method 1600 of forming a high voltage transistor device having a field plate according to the present disclosure. Although the first method 1600 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included.

At act 1602, a source region and a drain region are formed within a substrate. In some embodiments, the source region and the drain region may be separated by way of a body region and a drift region. A gate structure is formed over the body region and the drift region. FIG. 10 illustrates a cross-sectional view 1000 corresponding to some embodiments of act 1602.

At act 1604, a first inter-level dielectric (ILD) layer is formed over the substrate and the gate structure. FIG. 10 illustrates a cross-sectional view 1000 corresponding to some embodiments of act 1604.

At act 1606, a first etch process is performed on the first ILD layer, thereby defining at least one field plate opening over the drift region. FIG. 11 illustrates a cross-sectional view 1100 corresponding to some embodiments of act 1606.

At act 1608, a second etch process is performed on the first ILD layer, thereby defining contact openings over the drain region and the source region. FIG. 13 illustrates a cross-sectional view 1300 corresponding to some embodiments of act 1608.

At act 1610, a field plate is formed in the at least one field plate opening and contacts are formed in the contact openings. The field plate and the contacts comprise a same material. FIG. 14 illustrates a cross-sectional view 1400 corresponding to some embodiments of act 1610.

At act 1612, a second ILD layer is formed over the first ILD layer, and wires are formed in the second ILD layer over the contacts and the field plate. FIG. 15 illustrates a cross-sectional view 1500 corresponding to some embodiments of act 1612.

FIGS. 17-20, 21A, 21B, 21C, 22A, 22B, 22C, 23, and 24 illustrate cross-sectional views 1700-2000, 2100a, 2100b, 2100c, 2200a, 2200b, 2200c, 2300, and 2400 of some embodiments of a second method of forming a high voltage transistor device having a field plate according to the present disclosure. Although the cross-sectional views 1700-2000, 2100a, 2100b, 2100c, 2200a, 2200b, 2200c, 2300, and 2400 shown in FIGS. 17-20, 21A, 21B, 21C, 22A, 22B, 22C, 23, and 24 are described with reference to a method, it will be appreciated that the structures shown in FIGS. 17-20, 21A, 21B, 21C, 22A, 22B, 22C, 23, and 24 are not limited to the method but rather may stand alone separate of the method. Although FIGS. 17-20, 21A, 21B, 21C, 22A, 22B, 22C, 23, and 24 are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 17:
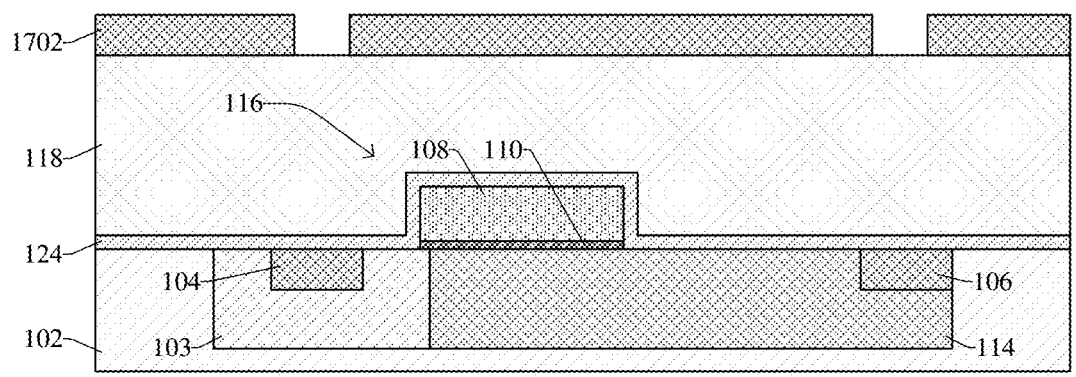
FIGS. 17-20, 21A, 21B, 21C, 22A, 22B, 22C, 23, and 24 illustrate cross-sectional views of some embodiments of a second method of forming a high voltage transistor device having a field plate.

As shown in cross-sectional view 1700 of FIG. 17, a gate structure 116 is formed over a substrate 102. In some embodiments, a method for forming the gate structure of FIG. 17 may comprise forming the gate dielectric layer 110 over the substrate 102. The gate electrode 108 is formed over the gate dielectric layer 110. After forming the gate electrode 108, the source region 104 and the drain region 106 may be formed in the substrate 102 by an implantation process. In some embodiments other doped regions (e.g., drift region 114 and body region 103) may be formed by one or more other implantation process(es) before forming the gate dielectric layer 110. In further embodiments, a portion of the doped regions may be formed before forming the gate dielectric layer 110, and/or a remaining portion of the other doped regions may be formed after forming the gate dielectric layer 110.

The CESL 124 is formed over the substrate 102 and around the gate structure 116. The first inter-level dielectric (ILD) layer 118 is formed over the CESL 124 and the gate structure 116. A first masking layer 1702 is formed over the first ILD layer 118 with openings overlying the source region 104 and the drain region 106. In some embodiments, the first masking layer 1702 may, for example, be or comprise a hard mask, a photoresist, or the like.

Figure 18:
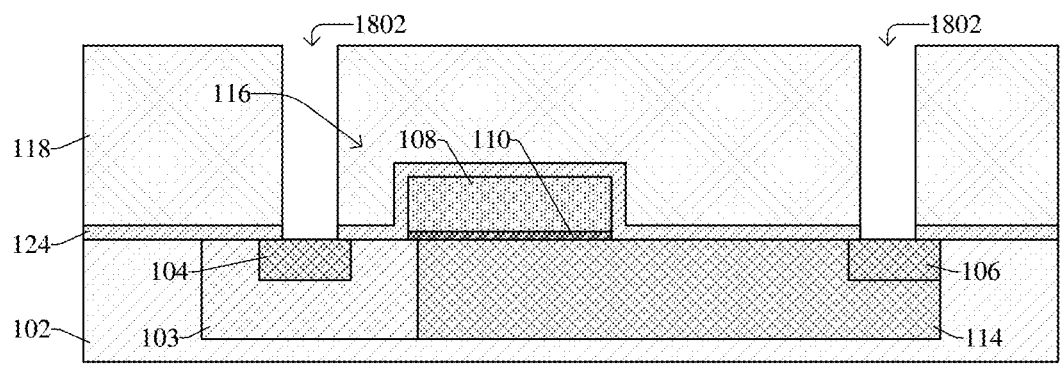

As shown in cross-sectional view 1800 of FIG. 18, a first etch process is performed on the structure of FIG. 17 according to the first masking layer (1702 of FIG. 17), thereby defining contact openings 1802. In some embodiments, the first etch process is a dry etch process in which the first ILD layer 118 and the CESL 124 are exposed to one or more etchants. In some embodiments, after performing the first etch process, a removal process is performed to remove the first masking layer (1702 of FIG. 17).

Figure 19:
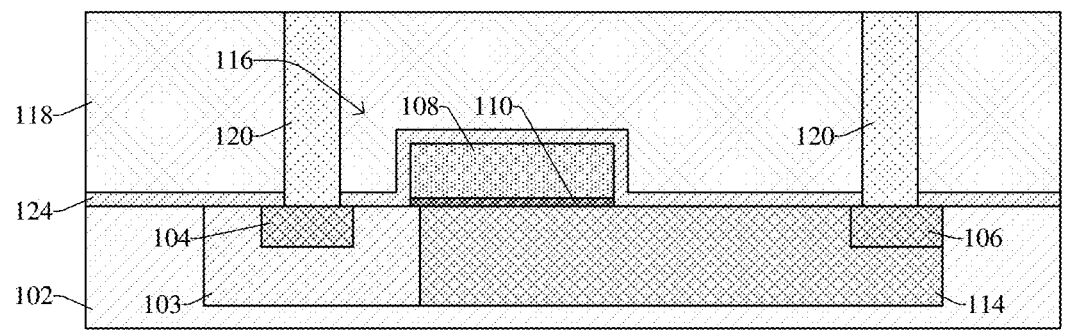

As shown in cross-sectional view 1900 of FIG. 19, contacts 120 are formed in the contact openings (1802 of FIG. 18). In some embodiments, the contacts 120 are formed by a damascene process. For example, a method for forming the contacts 120 includes: forming a conductive material (e.g., aluminum, titanium, tantalum, tungsten, titanium nitride, tantalum nitride, or the like) over the first ILD layer 118, thereby filling the contact openings (1802 of FIG. 18); and performing a planarization process (e.g., a CMP process) on the conductive materials until a top surface of the first ILD layer 118 is reached.

Figure 20:
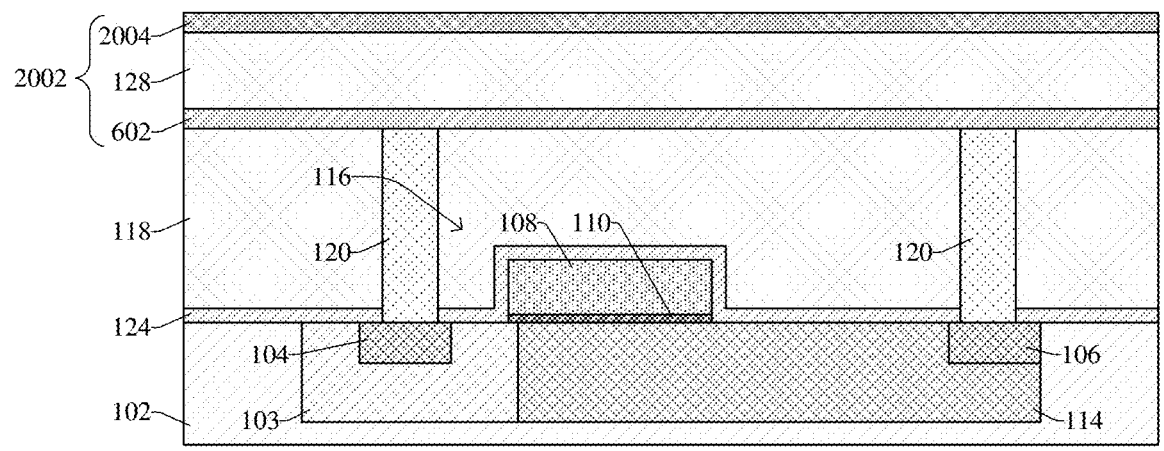

As shown in cross-sectional view 2000 of FIG. 20, a stack of dielectric layers 2002 is formed over the first ILD layer 118. The stack of dielectric layers 2002 include an upper etch stop layer 602, a second ILD layer 128, and anti-reflection layer 2004. In some embodiments, the stack of dielectric layers 2002 may be formed using deposition processes such as, for example, CVD, PVD, some other suitable deposition process(es), or any combination of the foregoing. In further embodiments, the anti-reflection layer 2004 is configured as a hard mask layer and may, for example, be or comprise silicon oxynitride, silicon oxynitrocarbide ($SiO_xN_yC_z$), or the like.

Figure 21A:
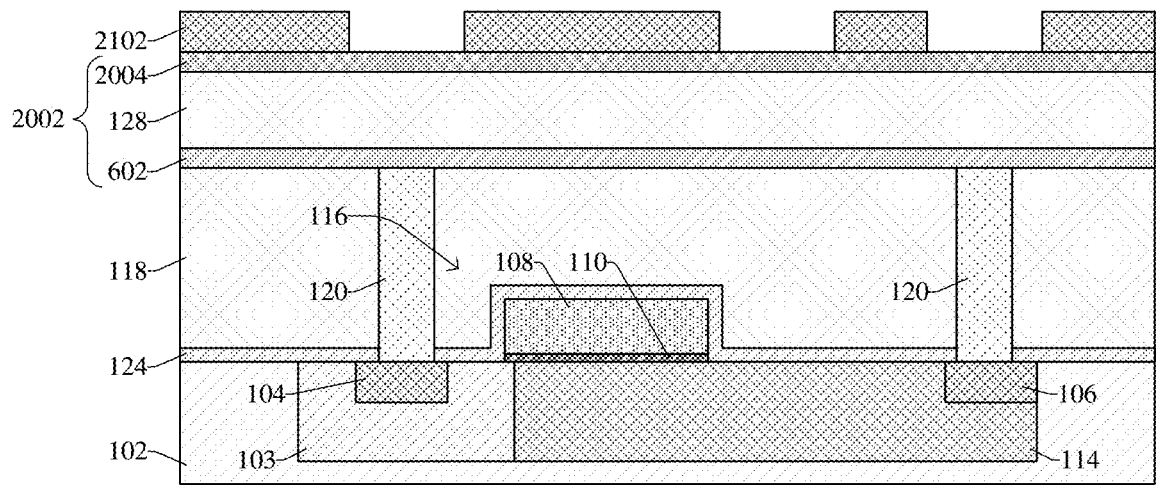
Figure 21B:
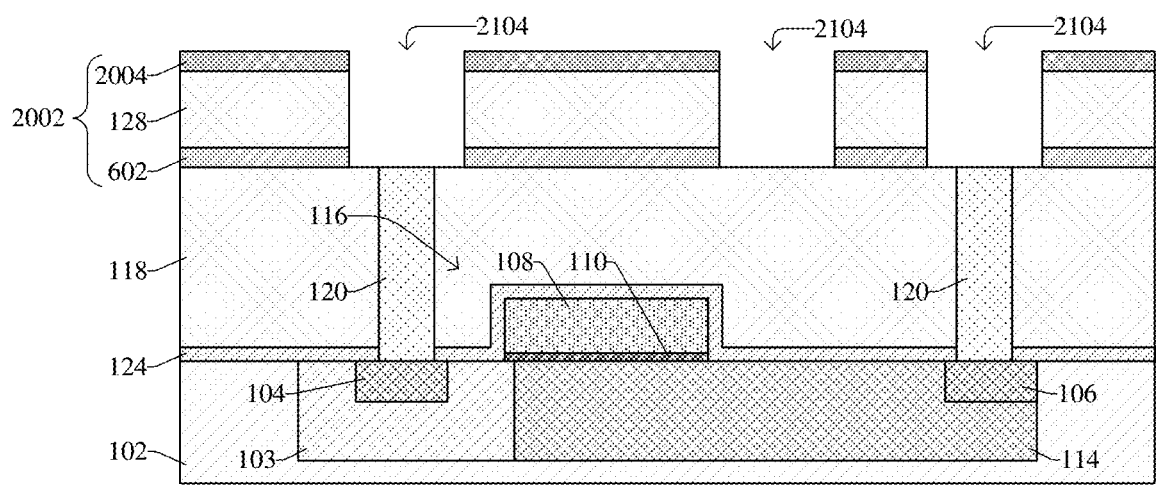
Figure 21C:
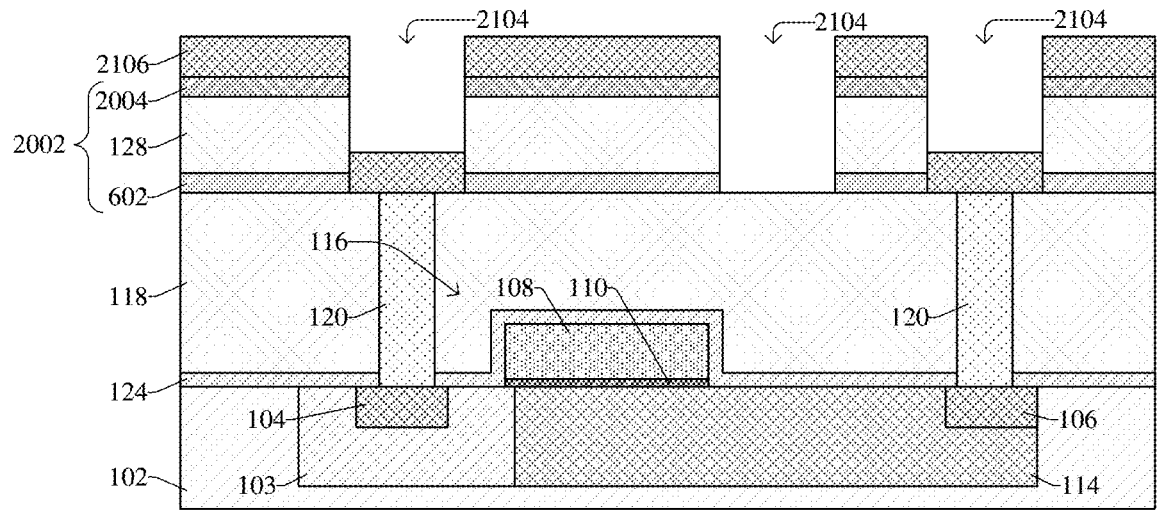
Figure 22A:
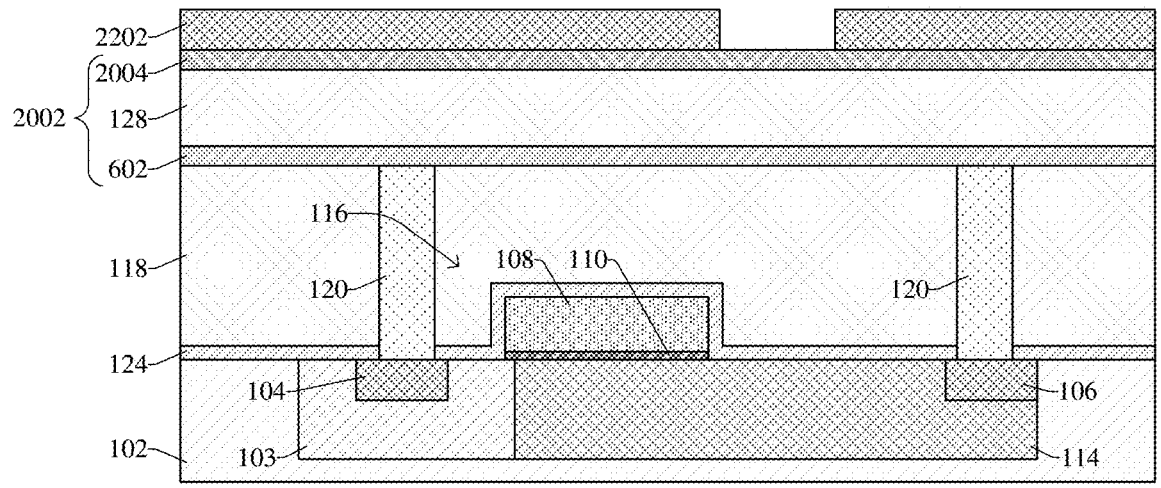
Figure 22B:
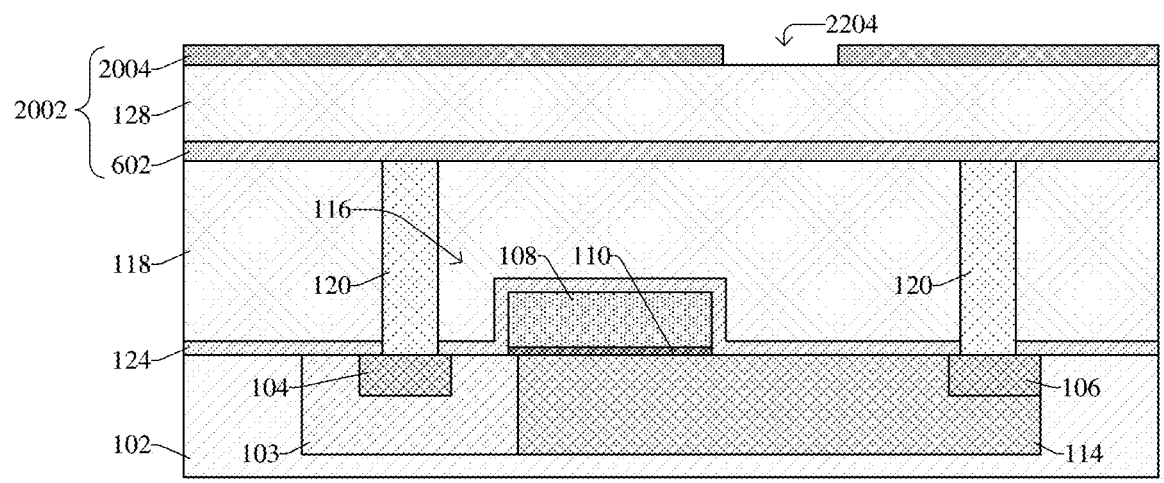
Figure 22C:
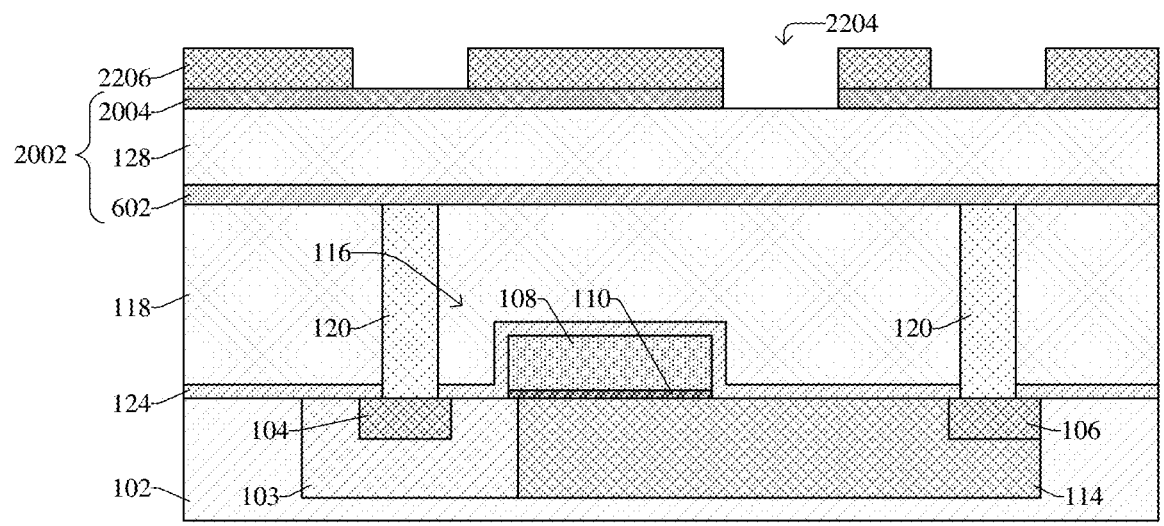

FIGS. 21A-21C illustrate cross-sectional views 2100a-2100c showing a first embodiments of the second method. FIGS. 22A-22C illustrate cross-sectional views 2200a-2200c corresponding to an alternative, second embodiment of the second method.

As shown in cross-sectional view 2100a of FIG. 21A, a second masking layer 2102 is formed over the anti-reflection layer 2004. In some embodiments, the second masking layer 2102 may, for example, be or comprise a photoresist.

As shown in cross-sectional view 2100b of FIG. 21B, a second etch process is performed on the stack of dielectric layers 2002, thereby defining a plurality of wire openings 2104. In some embodiments, the second etch process is a dry etch process that includes exposing the stack of dielectric layers 2002 to one or more etchants according to the second masking layer (2102 of FIG. 21A). In some embodiments, after performing the second etch process, a removal process is performed to remove the second masking layer (2102 of FIG. 21A).

As shown in cross-sectional view 2100c of FIG. 21C, a third masking layer 2106 is formed over the structure of FIG. 21B. The third masking layer 2106 partially fills a portion of the wire openings 2104 that overlie the contacts 120, and leaves a remaining portion of the wire opening 2104 overlying the drift region 114 unmasked. In some embodiments (not shown), the third masking layer 2106 may have sidewalls that are misaligned with sidewalls of the anti-reflection layer 2004. In such embodiments, the third masking layer 2106 may contact a top of the first ILD layer 118 along one side of the opening 2104 and not along the opposing side of the opening 2104. In such embodiments, an upper surface of the first ILD layer 128 will extend between a sidewall of the etch stop layer 602 and a sidewall of the first ILD layer 128 defining at least one field plate opening.

As shown in cross-sectional view 2200a of FIG. 22A, a fourth masking layer 2202 is formed over the anti-reflection layer 2004. In some embodiments, the fourth masking layer 2202 may, for example, be or comprise a photoresist.

As shown in cross-sectional view 2200b of FIG. 22B, a third etch process is performed on the structure of FIG. 22A, thereby defining at least one opening 2204 in the anti-reflection layer 2004. In some embodiments, the third etch process is a dry etch process.

As shown in cross-sectional view 2200c of FIG. 22C, a fifth masking layer 2206 is formed over the anti-reflection layer 2004. The fifth masking layer 2206 leaves the at least one opening 2204 unmasked. In some embodiments (not shown), the fifth masking layer 2206 may have sidewalls that are misaligned with sidewalls of the anti-reflection layer 2004. In such embodiments, the fifth masking layer 2206 may contact a top of the second ILD layer 128 along one side of the opening 2204 and not along the opposing side of the opening 2204. In such embodiments, a subsequent etch will define at least one field plate opening within the first ILD layer 128 that has opposing sidewalls laterally offset sidewalls of the at least one opening 2204. In other such embodiments, an upper surface of the first ILD layer 128 will extend between a sidewall of the etch stop layer 602 and a sidewall of the first ILD layer 128 defining the at least one field plate opening.

Figure 23:
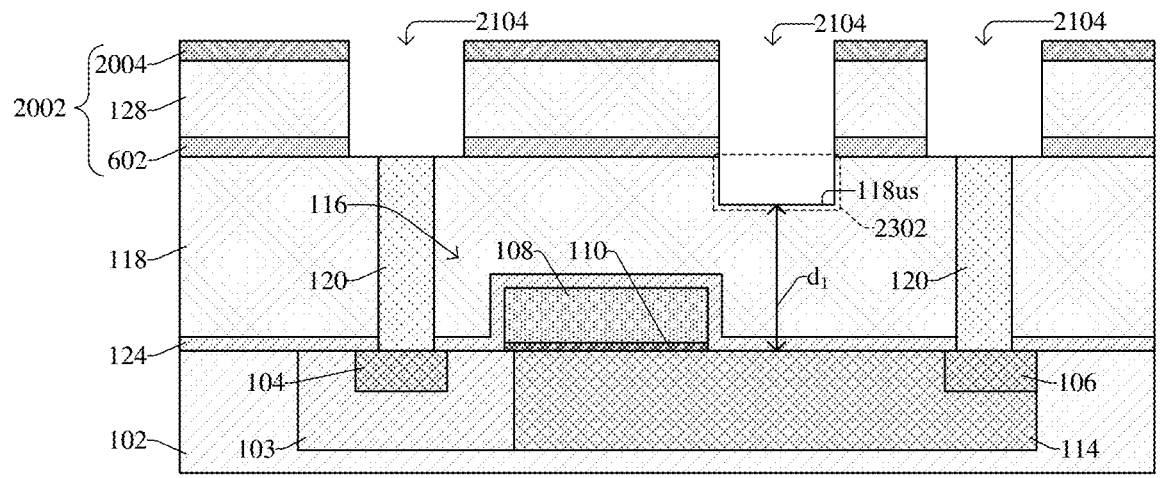

As shown in cross-sectional view 2300 of FIG. 23, a fourth etch process is performed on the structure of FIG. 21C or on the structure of FIG. 22C, thereby defining at least one field plate opening 2302. After performing the fourth etch process, an upper surface 118us of the first ILD layer 118 is vertically offset a top surface of the substrate 102 by a distance $d_1$. In some embodiments, the distance $d_1$ is within a range of about 5 to 100 nanometers and is defined by controlling a time of the fourth etch process. For example, a time duration of the fourth etch process is within a range of 0.1 to 1,000 seconds. In some embodiments, a power of the fourth etch process may be within a range of about 100 to 1,000 Watts.

In the first embodiment of the second method shown in FIGS. 21A-21C, the fourth etch process removes a portion of the first ILD layer 118, thereby defining the at least one field plate opening 2302. The fourth etch process may, for example, be a dry etch process, in which the first ILD layer 118 is exposed to one or more etchants. After performing the fourth etch process, a removal process is performed to remove the third masking layer (2106 of FIG. 21C).

In the second embodiment of the second method shown in FIGS. 22A-22C, the fourth etch process removes a portion of the stack of dielectric layers 2002 and a portion of the first ILD layer 118. Because the stack of dielectric layers 2002 has a smallest thickness over a position in which the field plate opening 2302 is to be formed, the fourth etch process etches the first ILD layer 118 to a greater depth in the at least one field plate opening 2302 than in surrounding parts of the first ILD layer 118. This defines wire openings 2104 and the at least one field plate opening 2302. The fourth etch process may, for example, be a dry etch process, in which the first ILD layer 118 and the stack of dielectric layers 2002 are exposed to one or more etchants. After performing the fourth etch process, a removal process is performed to remove the fifth masking layer (2206 of FIG. 22C).

Figure 24:
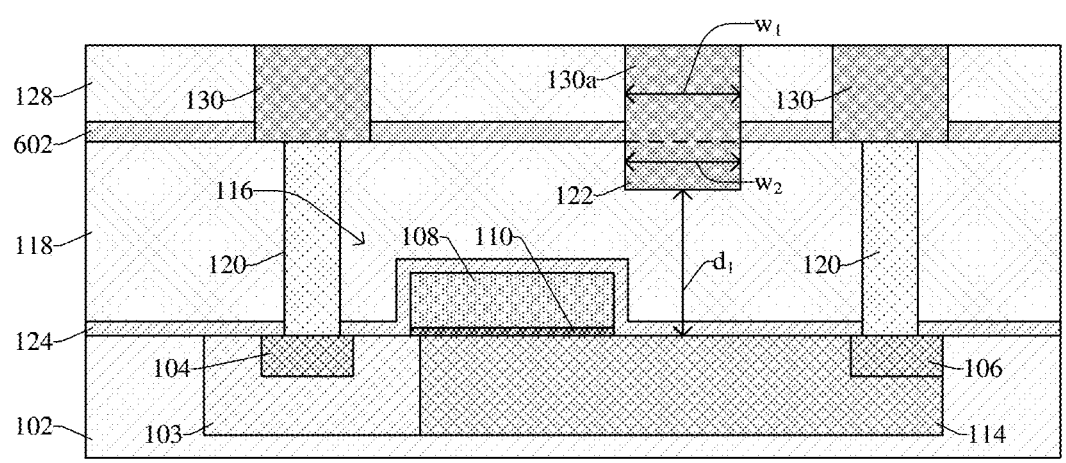

As shown in cross-sectional view 2400 of FIG. 24, wires 130 and a field plate 122 are formed in the wire openings (2104 of FIG. 23) and the at least one field plate opening (2302 of FIG. 23). The wires 130 include a field plate wire 130a. In some embodiments, a method for forming the aforementioned structures includes: forming a conductive material (e.g., aluminum, copper, or an alloy of the aforementioned) over the stack of dielectric layers 2002 and the first ILD layer 118, thereby filling the wire openings (2104 of FIG. 23) and the at least one field plate opening (2303 of FIG. 23); and performing a planarization process (e.g., a CMP) on the conductive material until a top surface of the second ILD layer 128 is reached, thereby removing the anti-reflection layer (2004 of FIG. 23). Thus, the field plate 122 comprises a same material (e.g., aluminum, copper, or an alloy of the aforementioned) as the wires 130 and is separated from the top surface of the substrate 102 by the distance $d_1$. In some embodiments, a first width $w_1$ of the field plate wire 130a is approximately equal to a second width $w_2$ of the field plate 122. In further embodiments, the field plate 122 and the field plate wire 130a are a single continuous material, such that the field plate 122 is a protrusion of the field plate wire 130a that extends from a bottom surface of the upper etch stop layer 602 into the first ILD layer 118.

Figure 25:
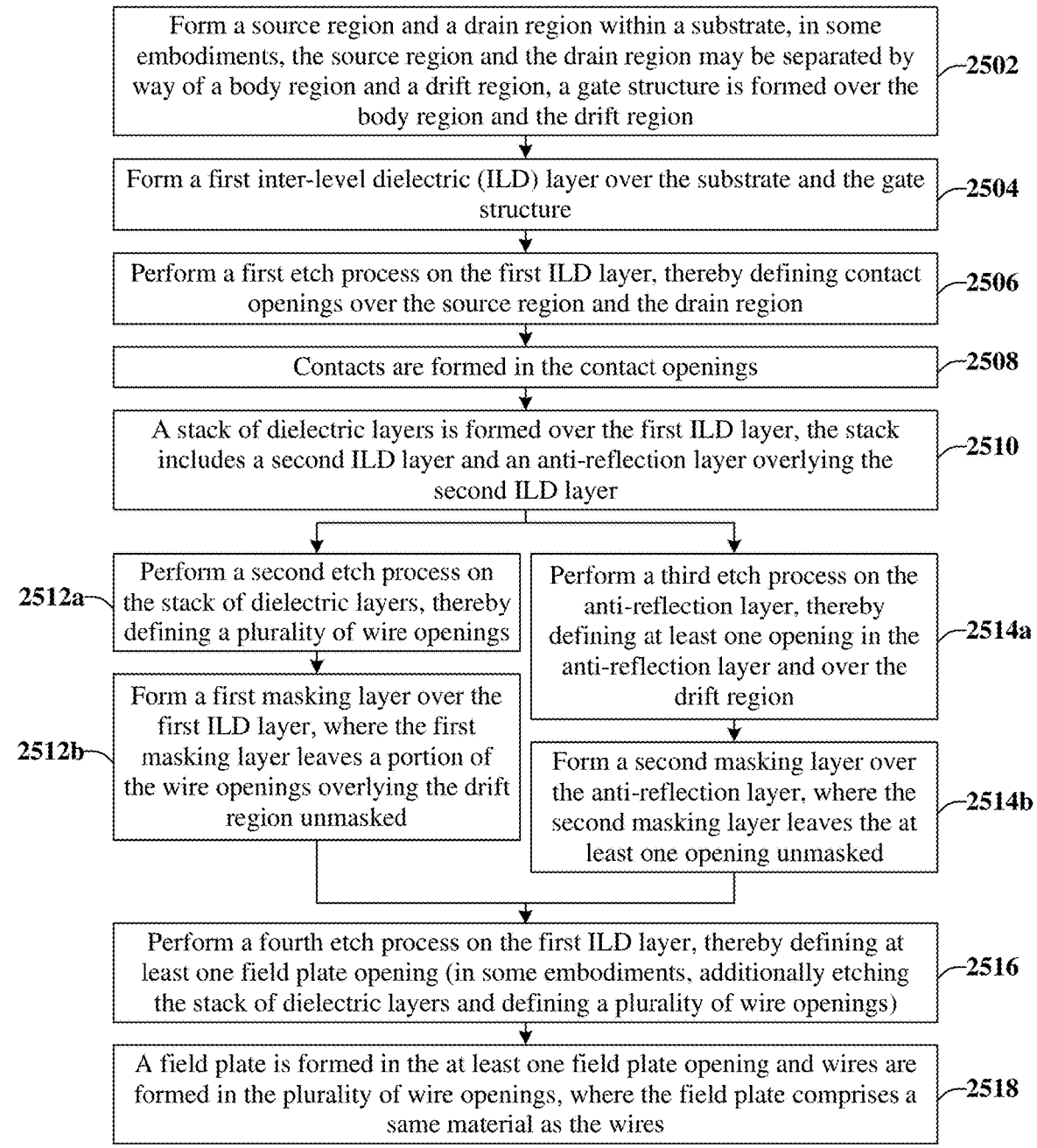
FIG. 25 illustrates a methodology in flowchart format that illustrates some embodiments of the second method of forming a high voltage transistor device having a field plate.

FIG. 25 illustrates a second method 2500 of forming a high voltage transistor device having a field plate according to the present disclosure. Although the second method 2500 is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts.

In some embodiments, some illustrated acts or events may be omitted, and other un-illustrated acts or events may be included.

At act 2502, a source region and a drain region are formed within a substrate. In some embodiments, the source region and the drain region may be separated by way of a body region and a drift region. A gate structure overlies the body region and the drift region. FIG. 17 illustrates a cross-sectional view 1700 corresponding to some embodiments of act 2502.

At act 2504, a first inter-level dielectric (ILD) layer is formed over the substrate and the gate structure. FIG. 17 illustrates a cross-sectional view 1700 corresponding to some embodiments of act 2504.

At act 2506, a first etch process is performed on the first ILD layer, thereby defining contact openings over the source region and the drain region. FIG. 18 illustrates a cross-sectional view 1800 corresponding to some embodiments of act 2506.

At act 2508, contacts are formed in the contact openings. FIG. 19 illustrates a cross-sectional view 1900 corresponding to some embodiments of act 2508.

At act 2510, a stack of dielectric layers is formed over the first ILD layer, the stack includes a second ILD layer and an anti-reflection layer overlying the second ILD layer. FIG. 20 illustrates a cross-sectional view 2000 corresponding to some embodiments of act 2510.

At act 2512a, a second etch process is performed on the stack of dielectric layers, thereby defining a plurality of wire openings. FIG. 21B illustrates a cross-sectional view 2100b corresponding to some embodiments of act 2512a.

At act 2512b, a first masking layer is formed over the first ILD layer. The first masking layer leaves a portion of the wire openings overlying the drift region unmasked. FIG. 21C illustrates a cross-sectional view 2100c corresponding to some embodiments of act 2512b.

At act 2514a, a third etch process is performed on the anti-reflection layer, thereby defining at least one opening in the anti-reflection layer and over the drift region. FIG. 22B illustrates a cross-sectional view 2200b corresponding to some embodiments of act 2514a.

At act 2514b, a second masking layer is formed over the anti-reflection layer. The second masking layer leaves the at least one opening unmasked. FIG. 22C illustrates a cross-sectional view 2200c corresponding to some embodiments of act 2514b.

At act 2516, a fourth etch process is performed on the first ILD layer, thereby defining at least one field plate opening. In some embodiments, the fourth etch process is performed on the stack of dielectric layers and defines a plurality of wire openings. FIG. 23 illustrates a cross-sectional view 2300 corresponding to some embodiments of act 2516.

At act 2518, a field plate is formed in the at least one field plate opening and wires are formed in the plurality of wire openings. The field plate comprises a same material as the wires. FIG. 24 illustrates a cross-sectional view 2400 corresponding to some embodiments of act 2518.

Accordingly, in some embodiments, the present disclosure relates to a high voltage device having a field plate that is formed concurrently with a formation of a conductive interconnect layer to enable a low-cost method of fabrication and/or decrease a breakdown voltage of the high voltage device.

In some embodiments, the present application provides an integrated chip including a gate electrode overlying a substrate between a source region and a drain region; a drift region arranged laterally between the gate electrode and the drain region; a plurality of inter-level dielectric (ILD) layers overlying the substrate, wherein the plurality of ILD layers includes a first ILD layer underlying a second ILD layer; a plurality of conductive interconnect layers disposed within the plurality of ILD layers; and a field plate extending from a top surface of the first ILD layer to a point that is vertically separated from the drift region by the first ILD layer, wherein the field plate is laterally offset the gate electrode by a non-zero distance in a direction toward the drain region, and wherein the field plate includes a same material as at least one of the plurality of conductive interconnect layers.

In some embodiments, the present application provides an integrated chip including a gate electrode overlying a substrate between a source region and a drain region; a contact etch stop layer (CESL) overlying the substrate and continuously extending over the gate electrode and from the source region to the drain region; a first inter-level dielectric (ILD) layer overlying the substrate; a second ILD layer overlying the first ILD layer; a plurality of contacts disposed within the first ILD layer and overlying the source region, the drain region, and the gate electrode; a plurality of wires disposed within the second ILD layer and overlying the contacts; and a field plate disposed within the first ILD layer between the gate electrode and the drain region, wherein a top surface of the field plate is aligned with a top surface of the contacts, wherein a bottom surface of the field plate is vertically offset an upper surface of the CESL by the first ILD layer.

In some embodiments, the present application provides a method for forming a high voltage transistor device. The method includes forming a source region and a drain region within a substrate, wherein the source region is separated from the drain region by way of a drift region, a gate structure overlies the substrate laterally between the source region and the drain region; forming a first inter-level dielectric (ILD) layer over the substrate; forming a plurality of contacts in the first ILD layer, wherein the contacts overlie the source region, the drain region, and the gate structure; performing a first etch process to define at least one field plate opening in the first ILD layer between the gate structure and the drain region, wherein the at least one field plate opening is defined by sidewalls and an upper surface of the first ILD layer; and forming a field plate in the at least one field plate opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a gate structure overlying a substrate between a source region and a drain region;
a drift region disposed laterally between the gate structure and the drain region;
a first dielectric layer overlying the substrate;
a field plate disposed within the first dielectric layer between the gate structure and the drain region;

a conductive wire overlying the first dielectric layer and contacting the field plate, wherein at least a portion of the conductive wire directly overlies a first sidewall of the drift region; and a diffusion barrier layer that extends along sidewalls of the conductive wire to along sidewalls and a lower surface of the field plate.

2. The integrated chip of claim 1, wherein the drift region comprises a second sidewall opposite the first sidewall, wherein the first and second sidewalls continuously laterally extend from a sidewall of the gate structure in a direction towards the drain region.

3. The integrated chip of claim 2, wherein the conductive wire continuously laterally extends from over the first sidewall of the drift region to a point over the second sidewall of the drift region.

4. The integrated chip of claim 2, wherein the field plate directly overlies the first and second sidewalls of the drift region.

5. The integrated chip of claim 1, wherein a bottom surface of the conductive wire directly contacts a top surface of the field plate.

6. The integrated chip of claim 1, wherein the conductive wire is laterally offset from the gate structure by a non-zero distance in a direction towards the drain region.

7. The integrated chip of claim 1, wherein a width of the field plate is equal to a width of the conductive wire.

8. The integrated chip of claim 1, wherein the field plate and the conductive wire are a single continuous conductive material, wherein the field plate continuously extends from a bottom surface of the conductive wire into the first dielectric layer.

9. An integrated chip, comprising:
a gate structure overlying a substrate between a source region and a drain region;
a dielectric layer overlying the substrate;
a plurality of conductive vias disposed within the dielectric layer and overlying the substrate;
a plurality of conductive wires overlying the plurality of conductive vias;
a field plate disposed within the dielectric layer and spaced laterally between the gate structure and the drain region; and
wherein a first conductive wire in the plurality of conductive wires has a bottom segment that extends below a top surface of the field plate along outer sidewalls of the field plate and laterally surrounds the outer sidewalls of the field plate.

10. The integrated chip of claim 9, wherein the top surface of the field plate is aligned with a top surface of the plurality of conductive vias.

11. The integrated chip of claim 9, wherein the field plate comprises a plurality of field plate vias, wherein the dielectric layer laterally separates the field plate vias from one another.

12. The integrated chip of claim 9, wherein the first conductive wire comprises a conductive core surrounded by a diffusion barrier layer that separates the field plate from the conductive core.

13. The integrated chip of claim 9, wherein the field plate and the conductive wires comprise a same material.

14. The integrated chip of claim 9, further comprising:
a drift region disposed laterally between the gate structure and the drain region, wherein the drift region and the drain region comprise a same doping type.

15. An integrated chip, comprising:
a gate structure overlying a substrate between a source region and a drain region;
a dielectric layer overlying the substrate;
a plurality of conductive vias disposed within the dielectric layer and overlying the substrate, wherein the plurality of conductive vias comprises a first conductive via overlying the drain region;
a plurality of conductive wires overlying the plurality of conductive vias; and
a field plate disposed within the dielectric layer between the gate structure and the first conductive via, wherein a first conductive wire of the plurality of conductive wires and the field plate are a single continuous conductive material.

16. The integrated chip of claim 15, wherein a width of the first conductive wire is greater than or equal to a width of the field plate.

17. The integrated chip of claim 15, further comprising:
a drift region disposed within the substrate between the gate structure and the drain region, wherein the first conductive wire overhangs an outer region of the drift region.

18. The integrated chip of claim 15, wherein the field plate comprises a plurality of field plate vias, wherein the dielectric layer laterally separates the field plate vias from one another.

19. The integrated chip of claim 18, wherein the field plate vias are laterally offset from one another in a direction towards the gate structure.

20. The integrated chip of claim 15, wherein a first lateral distance between the field plate and the gate structure is less than a second lateral distance between the field plate and the first conductive via.

* * * * *